United States Patent
Choi et al.

(10) Patent No.: US 11,626,227 B2
(45) Date of Patent: Apr. 11, 2023

(54) APPARATUSES AND METHODS FOR INCREASING MAGNETIC FLUX DENSITY USING SUPERCONDUCTORS

(71) Applicant: Massachusetts Institute of Technology, Cambridge, MA (US)

(72) Inventors: Hyeongrak Choi, Cambridge, MA (US); Dirk Robert Englund, Brookline, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 377 days.

(21) Appl. No.: 16/907,741

(22) Filed: Jun. 22, 2020

(65) Prior Publication Data
US 2021/0057135 A1 Feb. 25, 2021

Related U.S. Application Data

(60) Provisional application No. 62/890,117, filed on Aug. 22, 2019.

(51) Int. Cl.
*H01B 12/00* (2006.01)
*H01F 7/02* (2006.01)
*H01B 12/02* (2006.01)

(52) U.S. Cl.
CPC ........... *H01F 7/0273* (2013.01); *H01B 12/02* (2013.01)

(58) Field of Classification Search
CPC ........ H01B 12/00; H01B 12/02; H01B 12/04; H01B 12/06; H01B 12/08; H01B 12/10; H01B 12/12; H01B 12/14; H01B 12/16
See application file for complete search history.

(56) References Cited

U.S. PATENT DOCUMENTS

| 3,657,466 | A | * | 4/1972 | Woolcock | ............. | H01B 12/16 |
| | | | | | | 29/599 |
| 5,868,257 | A | * | 2/1999 | Stadtmuller | ............ | B03C 1/027 |
| | | | | | | 209/232 |
| 2004/0256141 | A1 | * | 12/2004 | Fujikami | ................ | H02G 15/34 |
| | | | | | | 174/15.5 |

(Continued)

OTHER PUBLICATIONS

Ball et al., "Publisher's Note:"Loop-gap microwave resonator for hybrid quantum systems" [Appl. Phys. Lett. 112, 204102 (2018)]." Applied Physics Letters 113.3 (2018): 039903. 6 pages.

(Continued)

*Primary Examiner* — Pete T Lee
(74) *Attorney, Agent, or Firm* — Smith Baluch LLP

(57) ABSTRACT

Using the Meissner effect in superconductors, demonstrated here is the capability to create an arbitrarily high magnetic flux density (also sometimes referred to as "flux squeezing"). This technique has immediate applications for numerous technologies. For example, it allows the generation of very large magnetic fields (e.g., exceeding 1 Tesla) for nuclear magnetic resonance (NMR), magnetic resonance imaging (MRI), the generation of controlled magnetic fields for advanced superconducting quantum computing devices, and/or the like. The magnetic field concentration/increased flux density approaches can be applied to both static magnetic fields (i.e., direct current (DC) magnetic fields) and time-varying magnetic fields (i.e., alternating current (AC) magnetic fields) up to microwave frequencies.

17 Claims, 29 Drawing Sheets

(56) References Cited

U.S. PATENT DOCUMENTS

| | | | | |
|---|---|---|---|---|
| 2008/0086438 | A1* | 4/2008 | Amin | B82Y 10/00 |
| | | | | 977/933 |
| 2008/0252404 | A1 | 10/2008 | Coombs | |
| 2010/0227764 | A1* | 9/2010 | Willen | H01B 12/16 |
| | | | | 505/231 |
| 2014/0314419 | A1 | 10/2014 | Paik | |
| 2017/0236627 | A1* | 8/2017 | Walsh | H02K 55/00 |
| | | | | 62/51.1 |

OTHER PUBLICATIONS

Creedon et al., "Strong coupling between P 1 diamond impurity centers and a three-dimensional lumped photonic microwave cavity." Physical Review B 91.14 (2015): 140408. 5 pages.

International Search Report and Written Opinion in International Patent Application No. PCT/US2020/038916 dated Oct. 2020, 11 pages.

Kubo et al., "Electron spin resonance detected by a superconducting qubit" Physical Review B 86.6 (2012): 064514. 6 pages.

Kubo et al., "Hybrid quantum circuit with a superconducting qubit coupled to a spin ensemble." Physical review letters 107.22 (2011): 220501. 5 pages.

Kubo et al., "Strong coupling of a spin ensemble to a superconducting resonator." Physical review letters 105.14 (2010): 140502. 4 pages.

Le Floch et al., "Towards achieving strong coupling in three-dimensional-cavity with solid state spin resonance." Journal of Applied Physics 119.15 (2016): 153901. 9 pages.

* cited by examiner

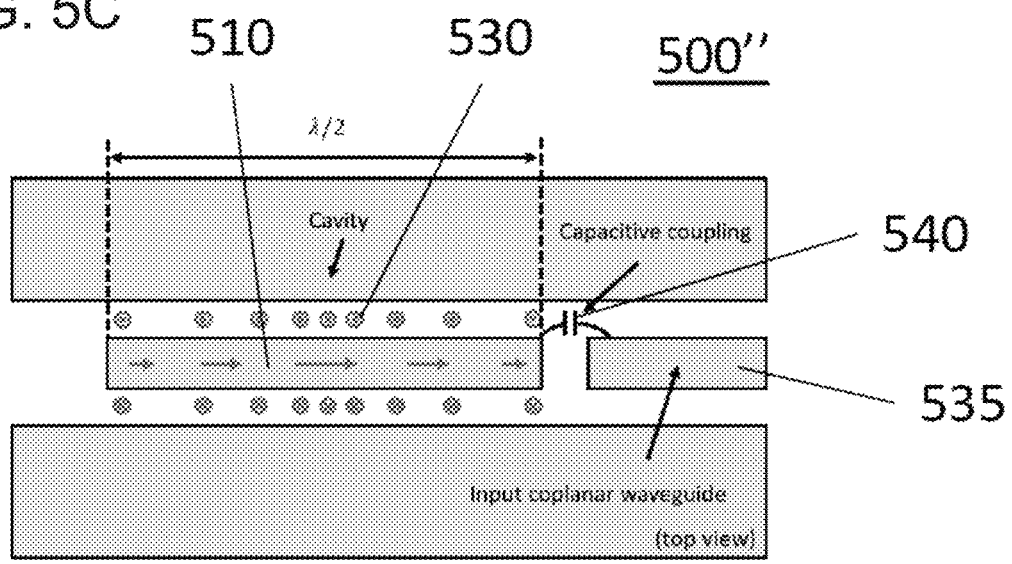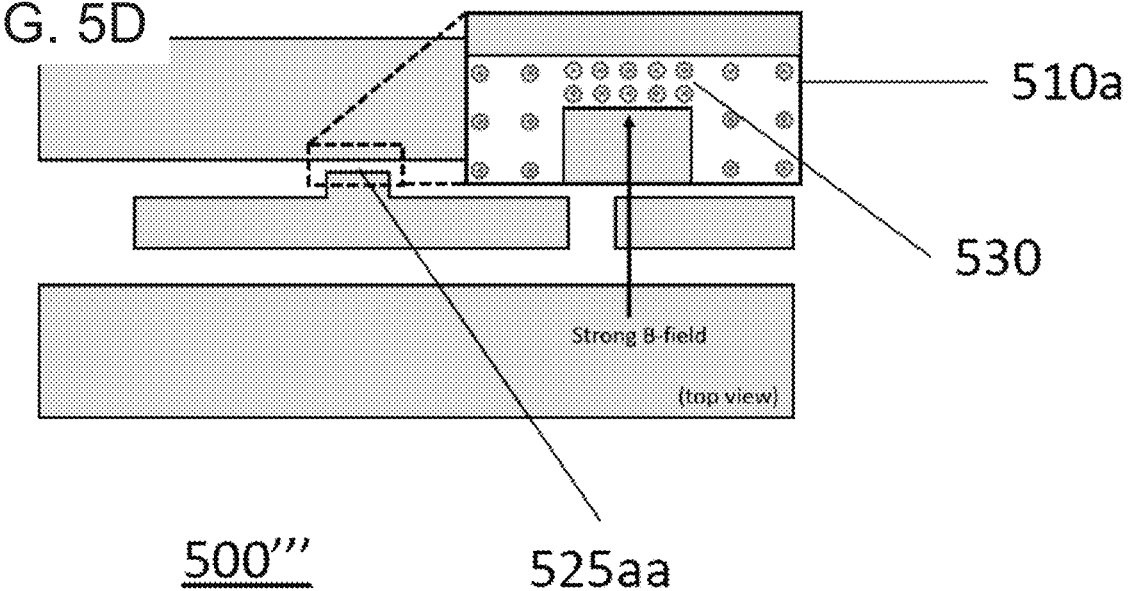

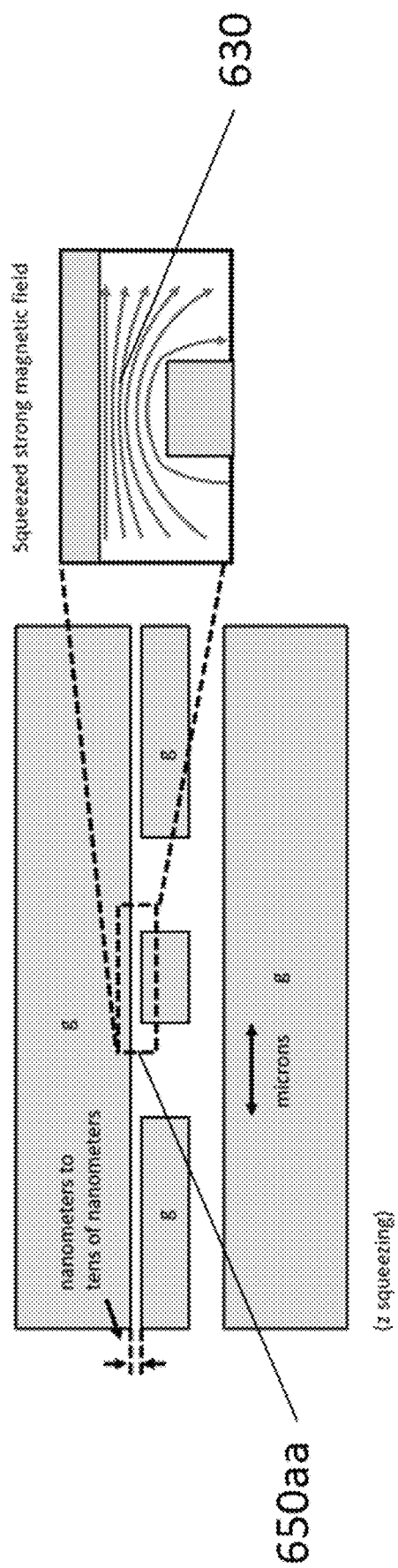

FIG. 11A
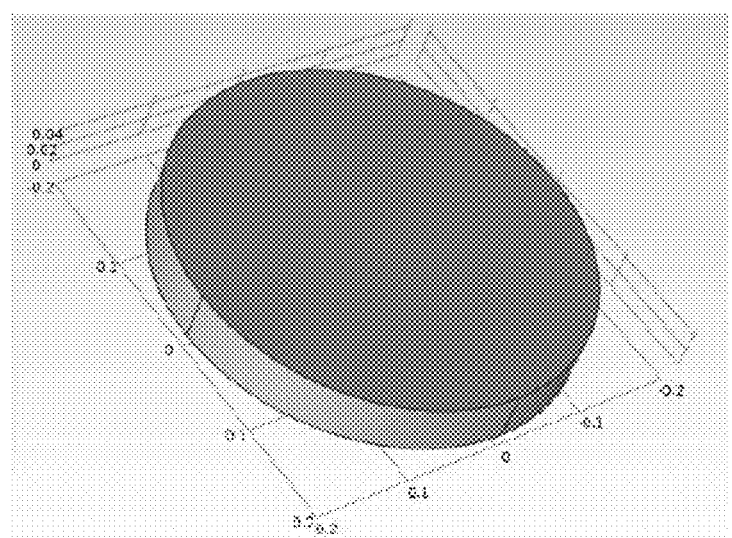

FIG. 11C
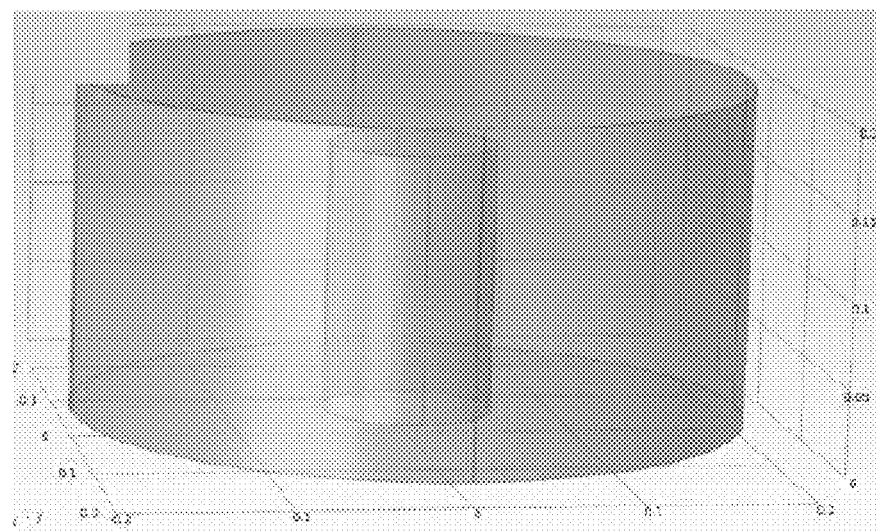
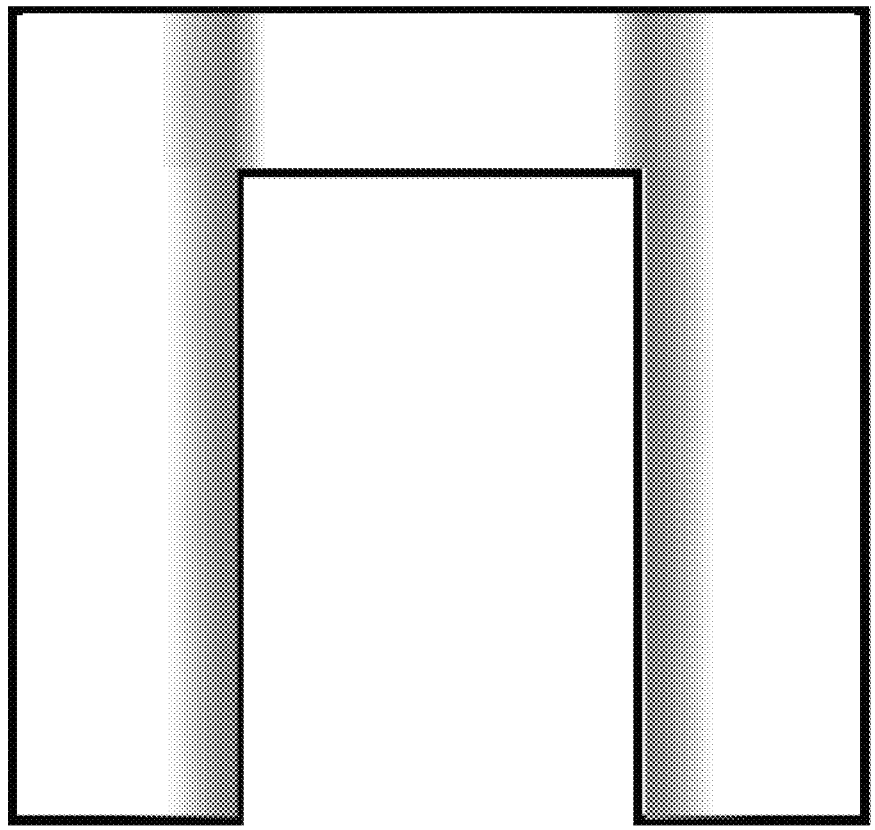

FIG. 11D
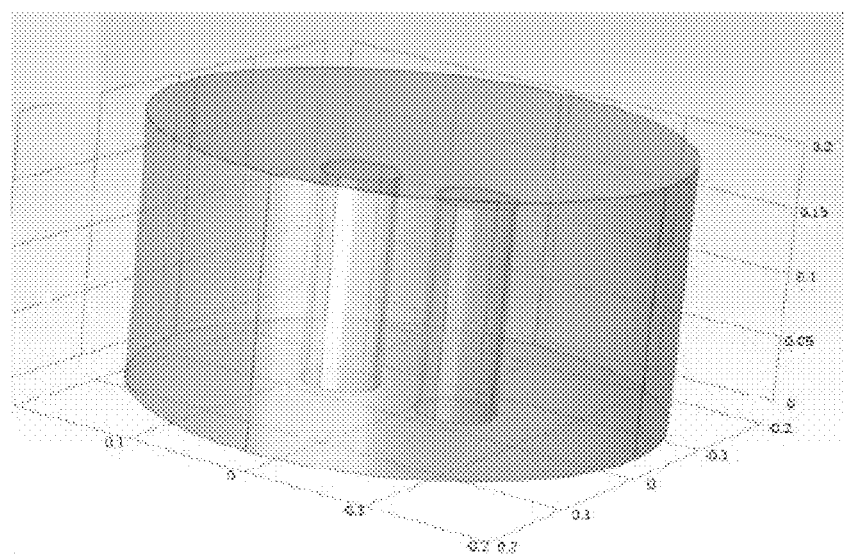
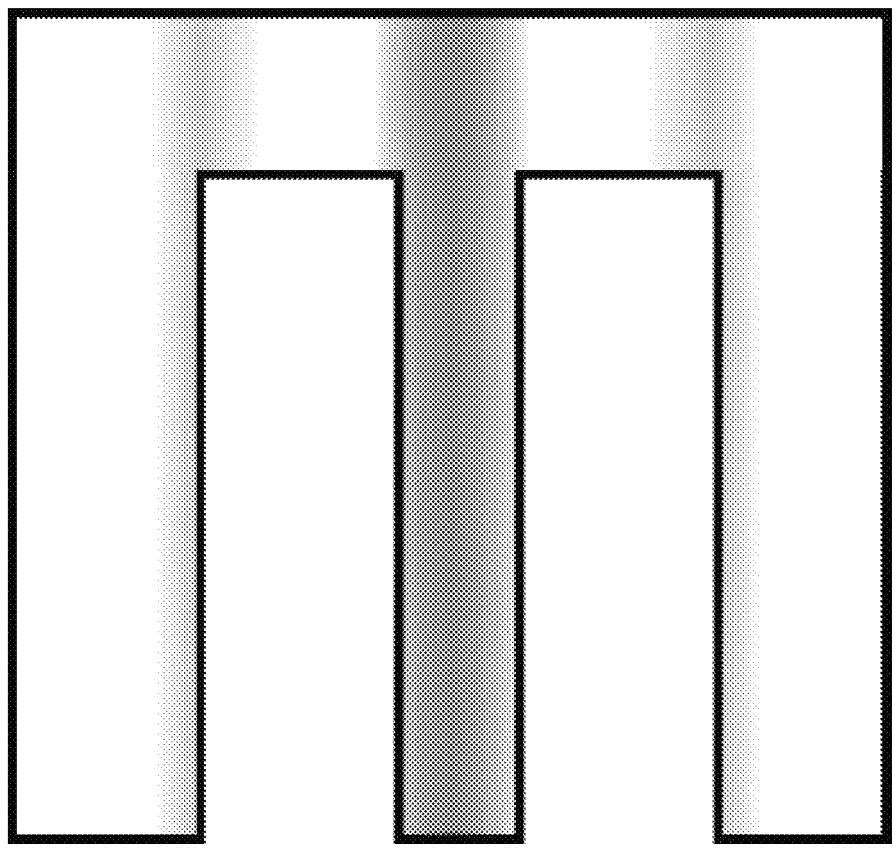

FIG. 12B
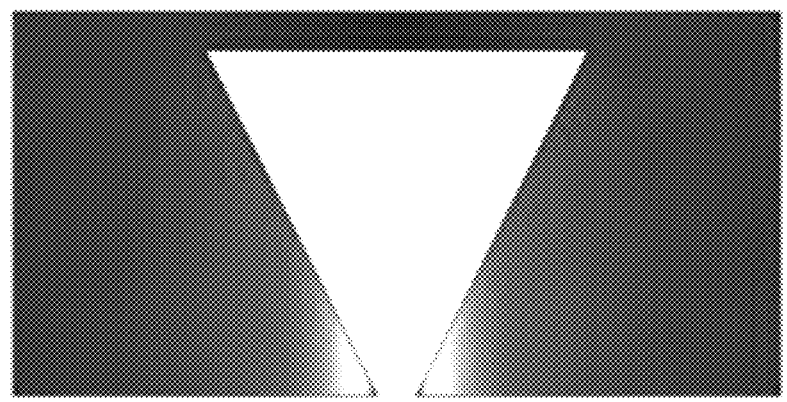
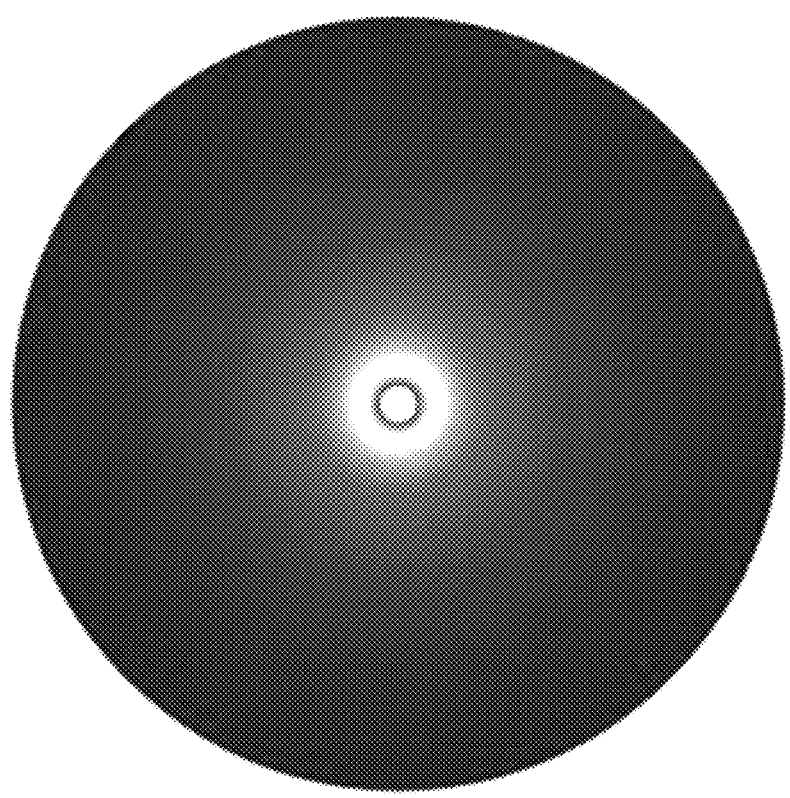
FIG. 12C

FIG. 12E
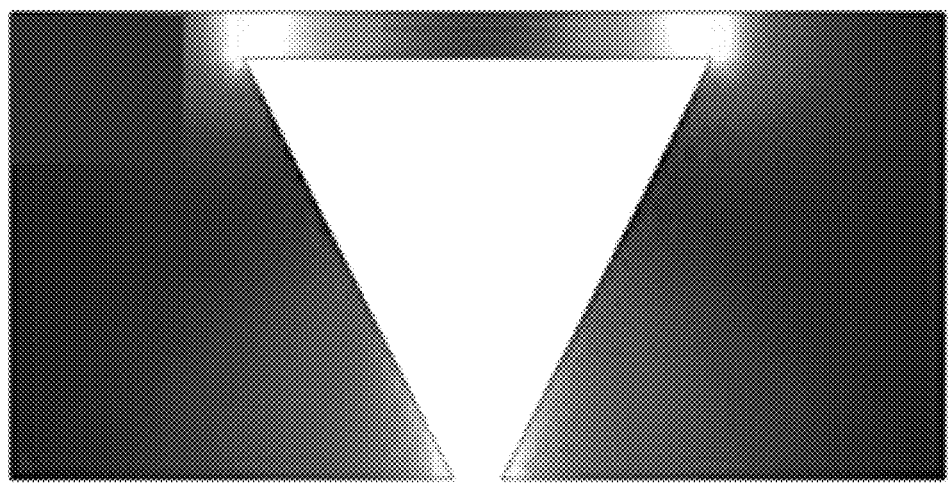
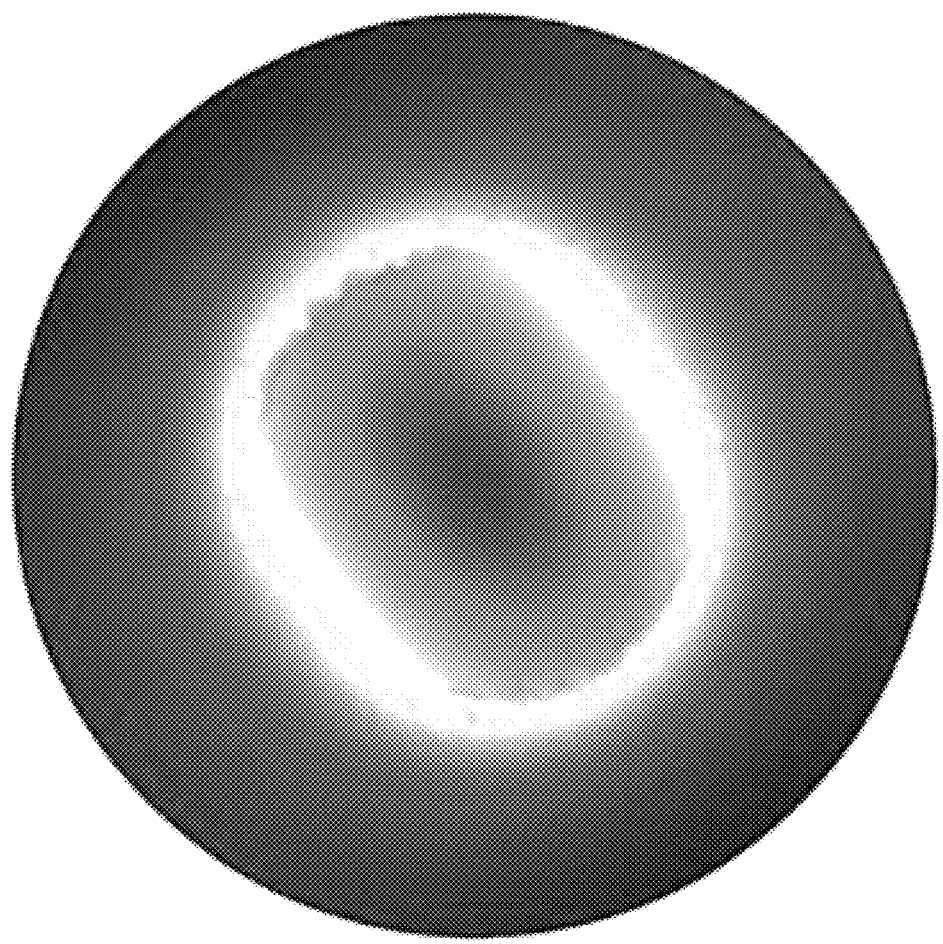
FIG. 12F

APPARATUSES AND METHODS FOR INCREASING MAGNETIC FLUX DENSITY USING SUPERCONDUCTORS

CROSS-REFERENCE TO RELATED APPLICATIONS

This applications claims priority to U.S. Provisional Application No. 62/890,117 filed Aug. 22, 2019, the entire disclosure of which is incorporated herein by reference.

STATEMENT OF GOVERNMENT SUPPORT

This invention was made with government support under Grant No. D18AC00014 awarded by the Department of Interior (DOI). The government has certain rights in the invention.

BACKGROUND

The ability to control the spatial profile and/or strength of magnetic fields is important to numerous technologies. An outstanding challenge is the spatial concentration of magnetic fields. While electric fields can be concentrated using capacitive approaches, magnetic fields cannot be readily concentrated to small mode volumes. This problem has direct implications on several applications, ranging from quantum computing to magnetic resonance imaging to high-performance electronics.

SUMMARY

An apparatus includes a source to generate a magnetic field, and an enclosure to receive the generated magnetic field. The apparatus also includes a superconductor element, disposed in the enclosure such that a gap is created between an edge of the superconductor and a wall of the enclosure, to increase a magnetic flux density of the magnetic field in the gap.

An apparatus for electrical transmission includes a first conductive element, defining a first plane, to conduct an electrical signal and to generate a magnetic field in response to the electrical signal, the first conductive element including a raised portion. The apparatus also includes a second conductive element electrically isolated from the first conductive element and disposed in the first plane. A first gap is formed in the first plane between the first conductive element and the second conductive element, the magnetic field being present in the first gap. The first gap has a) a first width between the raised portion and the second conductive element and b) a second width between a remainder of the first conductive element and the second conductive element, the first width being smaller than the second width, to increase magnetic flux density of the magnetic field in the raised portion.

A method includes disposing a superconductor element in an enclosure such that a gap is created between an edge of the superconductor and a wall of the enclosure. The method further includes applying a magnetic field to the enclosure, wherein a magnetic flux density of the magnetic field in the gap is greater than a magnetic flux density of the magnetic field in free space.

An apparatus for electrical transmission includes a first conductive element, defining a first plane, to conduct an electrical signal along a first axis and to generate a magnetic field based on the electrical signal. The apparatus also includes a second conductive element electrically isolated from the first conductive element and disposed in a second plane parallel to the first plane, wherein a first gap having a first width is formed between the first conductive element and the second conductive element. The apparatus also includes a third conductive element electrically isolated from the first conductive element and disposed in a third plane parallel to the first plane and the second plane, wherein a second gap having a second width greater than the first width is formed between the first conductive element and the third conductive element. Magnetic flux density of the magnetic field in the first gap is greater than in the second gap.

An apparatus for generating a magnetic field includes a source to generate a magnetic field, and a superconductor element disposed in the magnetic field and defining a plane perpendicular to field lines of the magnetic field. The superconductor element includes an orifice to focus the magnetic fields through the orifice and increasing magnetic flux density of the magnetic field.

An apparatus for sensing a magnetic field includes a superconductor element disposed in a magnetic field and defining a plane perpendicular to field lines of the magnetic field. The superconductor element includes an orifice, to focus the magnetic field from a first side of the orifice, through the orifice, and to increase magnetic flux density of the magnetic field on a second side of the orifice.

An apparatus includes a cylindrical cavity defining a longitudinal plane about a central axis, to store electromagnetic energy and to generate a magnetic field within the cylindrical cavity based on the electromagnetic energy. The apparatus also includes a superconductor element disposed in the cylindrical cavity in the longitudinal plane and electrically isolated from the cylindrical cavity, wherein a first gap is formed between the superconductor element and the cylindrical cavity, and wherein the magnetic field in the first gap has an increased magnetic flux density relative to the magnetic field elsewhere in the cylindrical cavity. The apparatus further includes a superconducting qubit circuit disposed in the first gap.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

Figure 2:
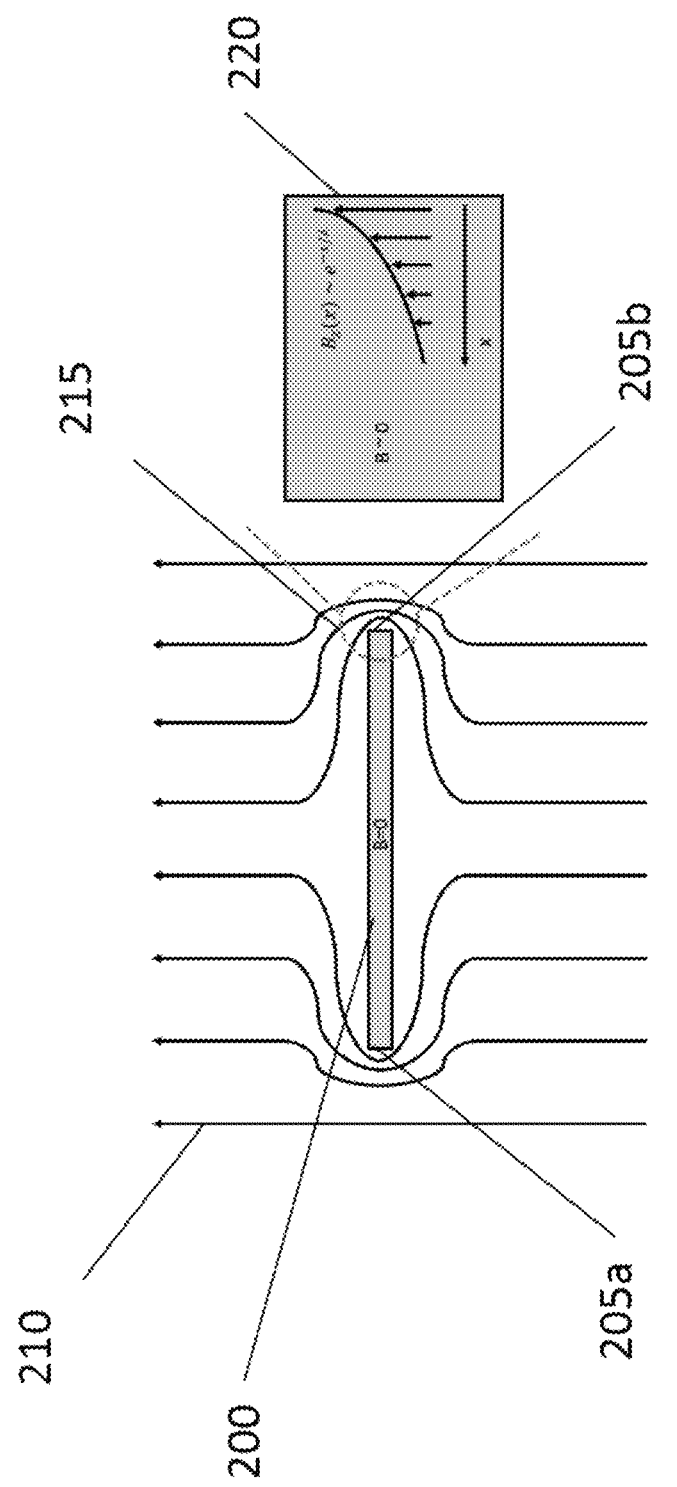

FIG. 2 illustrates concentration of magnetic flux density at the edge of a thin superconducting slab that is arranged perpendicular to the external flux direction. The inset plot (right) illustrates that the magnetic flux density decays exponentially in the superconducting slab from the superconducting slab's edge (where x is the distance from the edge of the superconductor to its interior) with a penetration depth $\lambda$.

Figure 3A:
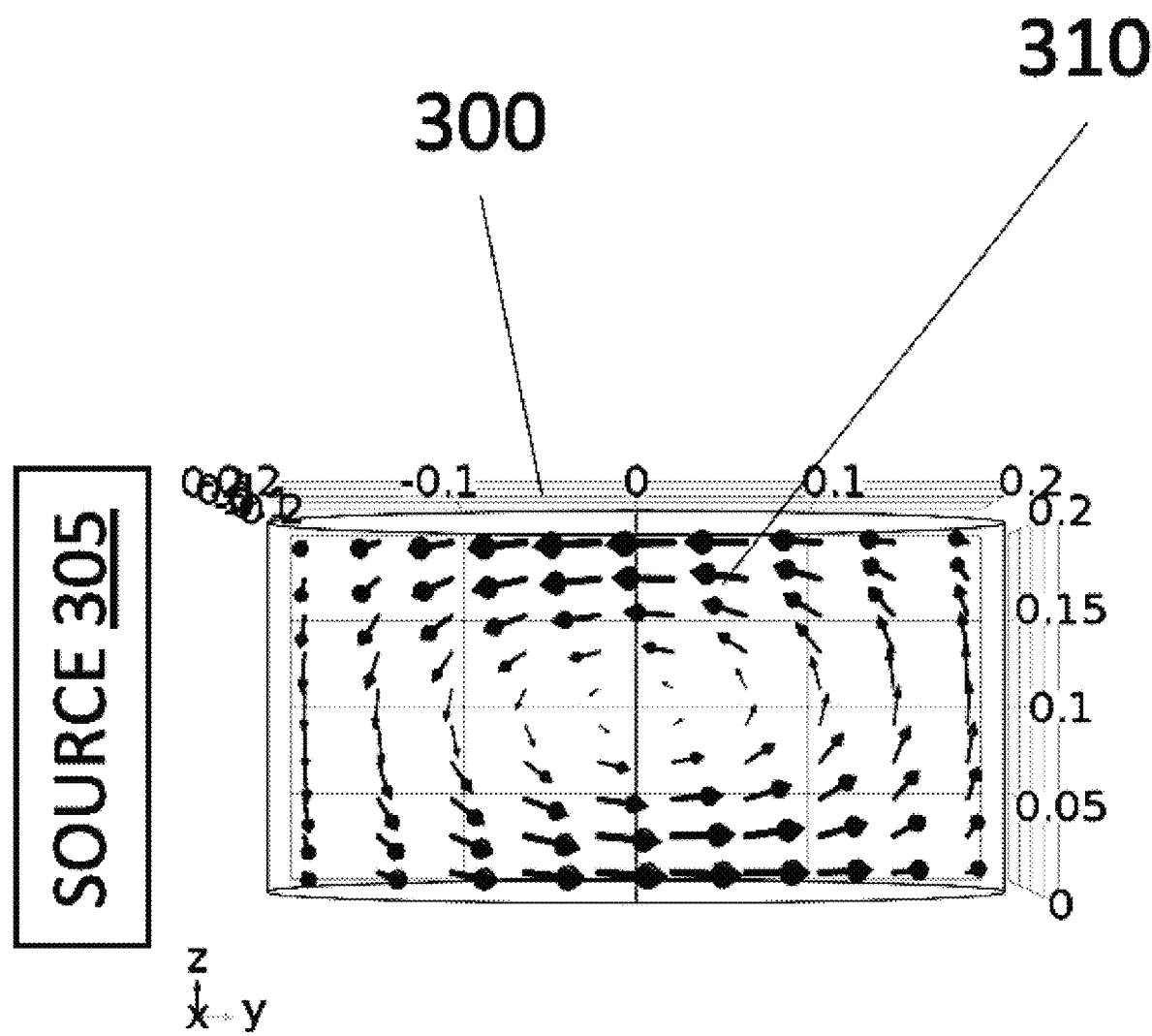

FIG. 3A illustrates field vectors, in the YZ plane, for a magnetic field H(r) in a cross-sectional view of a microwave cylindrical resonator. Field spreads out in the resonator with a volume of $\lambda^3$, where the $\lambda$ is a wavelength of the electromagnetic field in the medium. The axis are in meters.

Figure 3B:
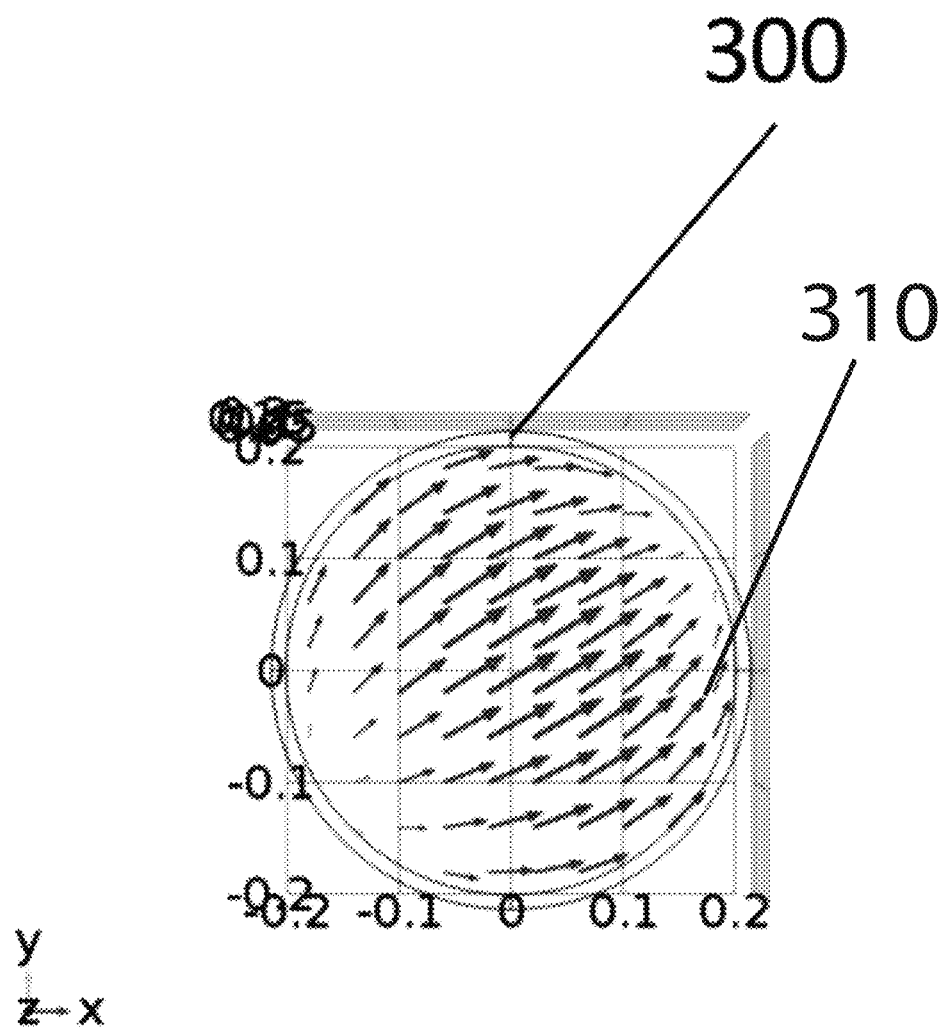

FIG. 3B illustrates the magnetic field vectors of FIG. 3A in the XY-plane.

Figure 4A:
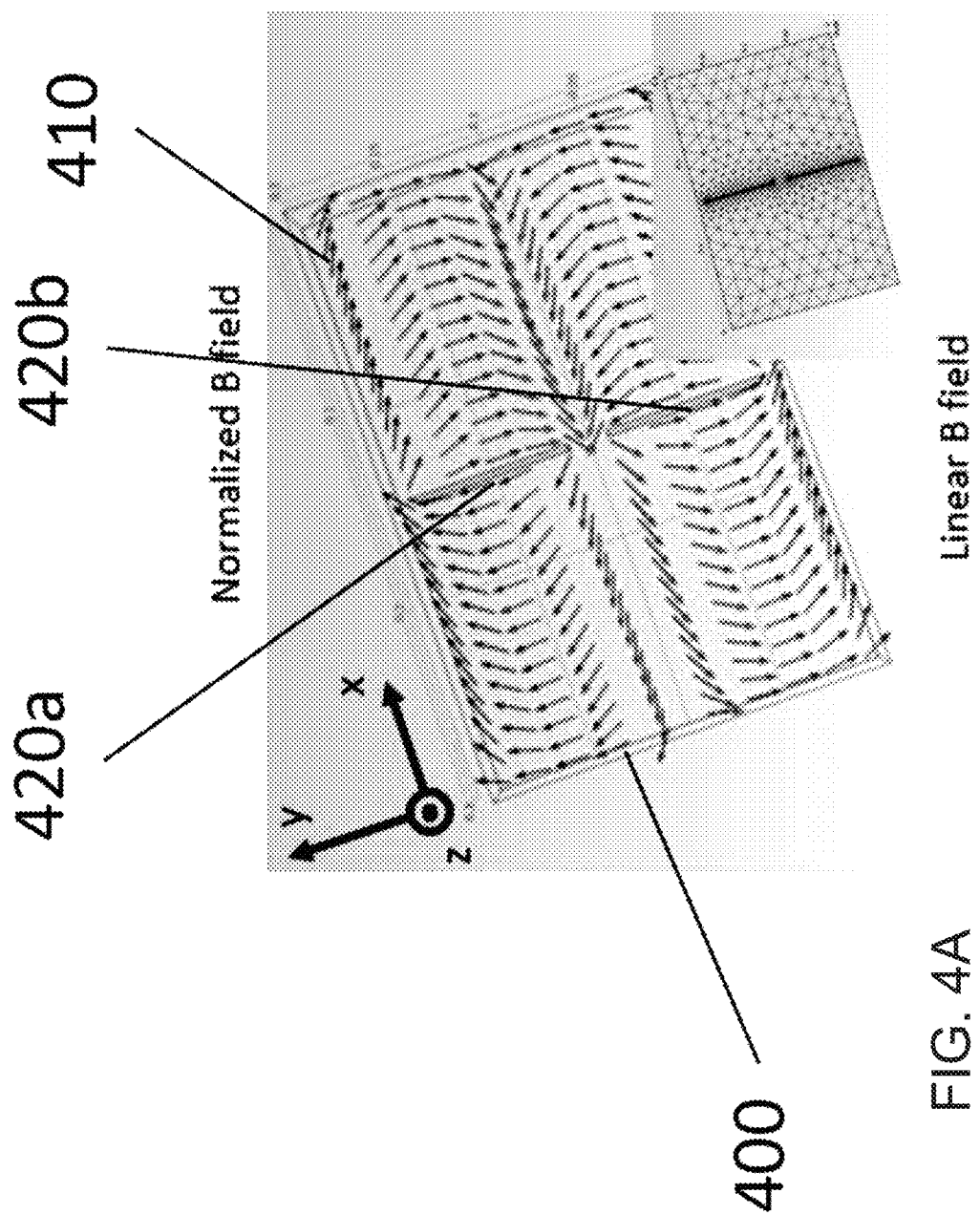

FIG. 4A illustrates a superconducting slab positioned in a radio-frequency (RF) resonator that concentrates the magnetic flux density (magnetic field) through small gaps. Spaces are filled with a dielectric material ($\epsilon_r$=4.2). The mode resonant at 730 MHz is shown as an example. The field lines are normalized B-field, B(r)/|B(r)| for r in the x-y plane, with a 'fine' mesh size setting in COMSOL Multiphysics software (physics-controlled). The inset shows the mesh used in the simulation and illustrates the 'fine' mesh size used. The axis are in meters.

Figure 4B:
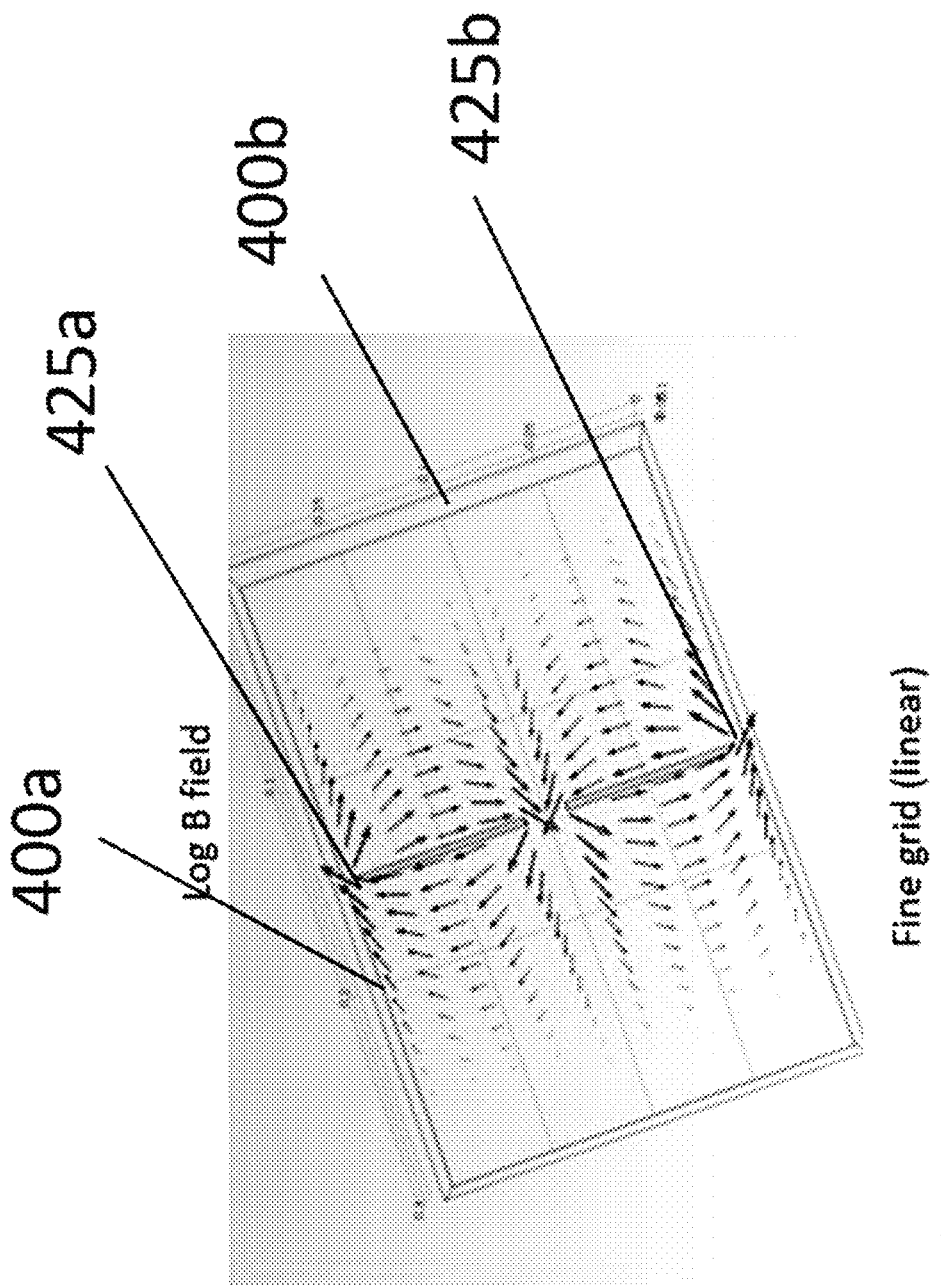

FIG. 4B illustrates the setup of FIG. 4A, with the field lines representing log(|B(r)|/max(|B(r)|)).

Figure 4C:
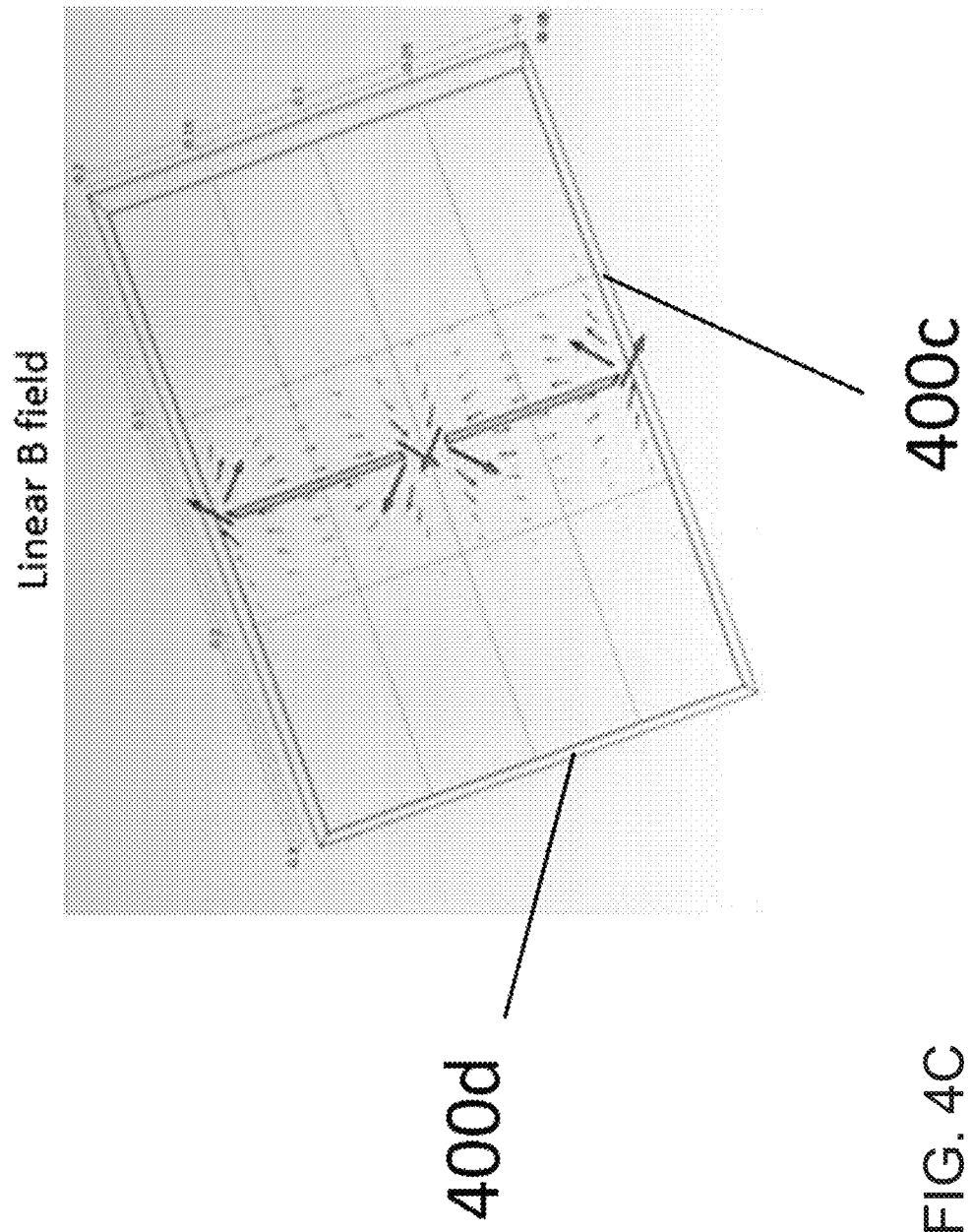

FIG. 4C illustrates the setup of FIG. 4A, with the field lines representing B(r).

Figure 4D:
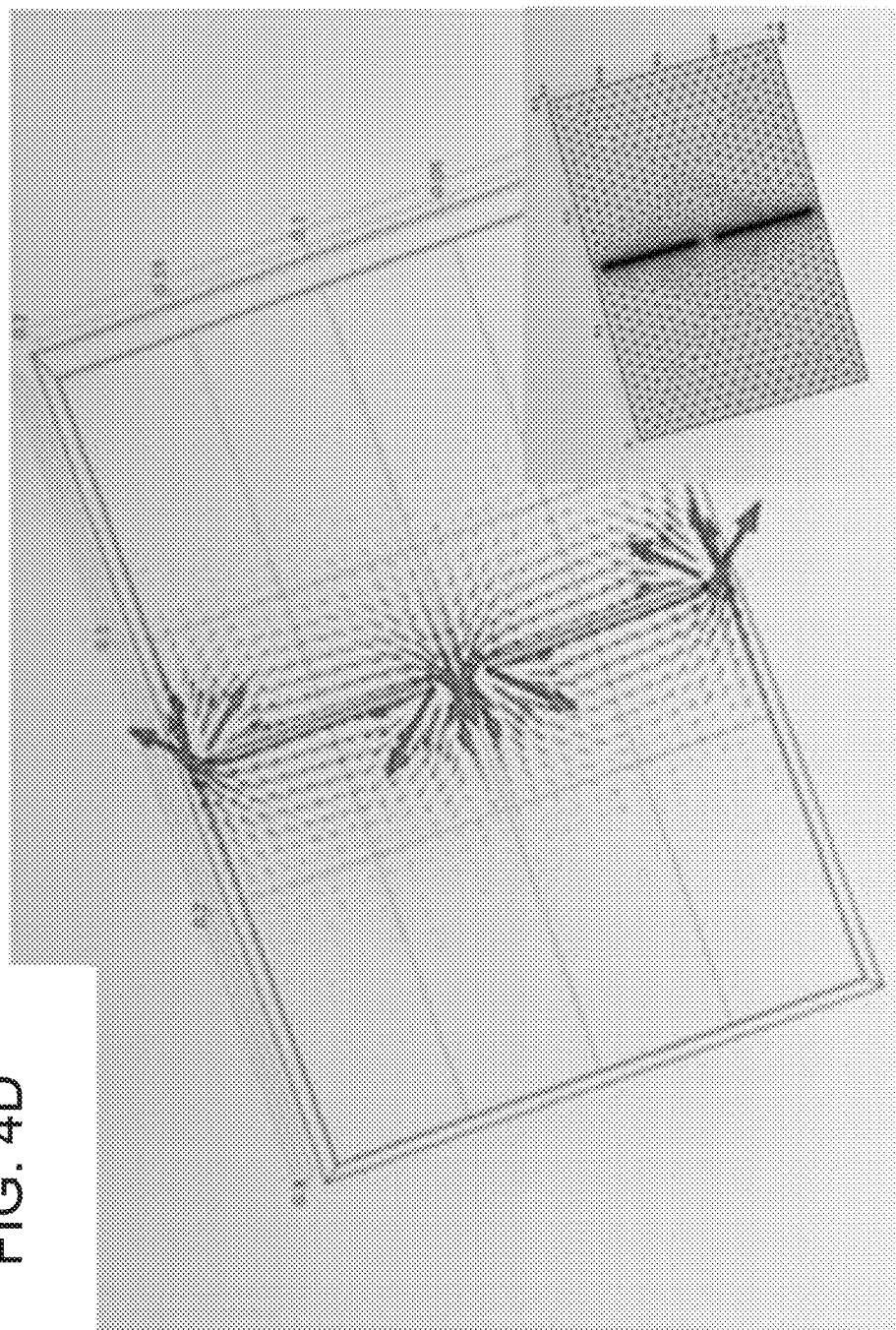

FIG. 4D illustrates the setup of FIG. 4A, with the mesh size reduced to 'extra fine' setting. The inset shows the mesh used in the simulation and illustrates the 'extra fine' mesh size used. The magnetic field at the corners/edges of the superconductor increases relative to that illustrated in FIG. 4A. This trend continues until the mesh is of the order of the superconductor penetration depth $\lambda_L$.

Figure 5A:
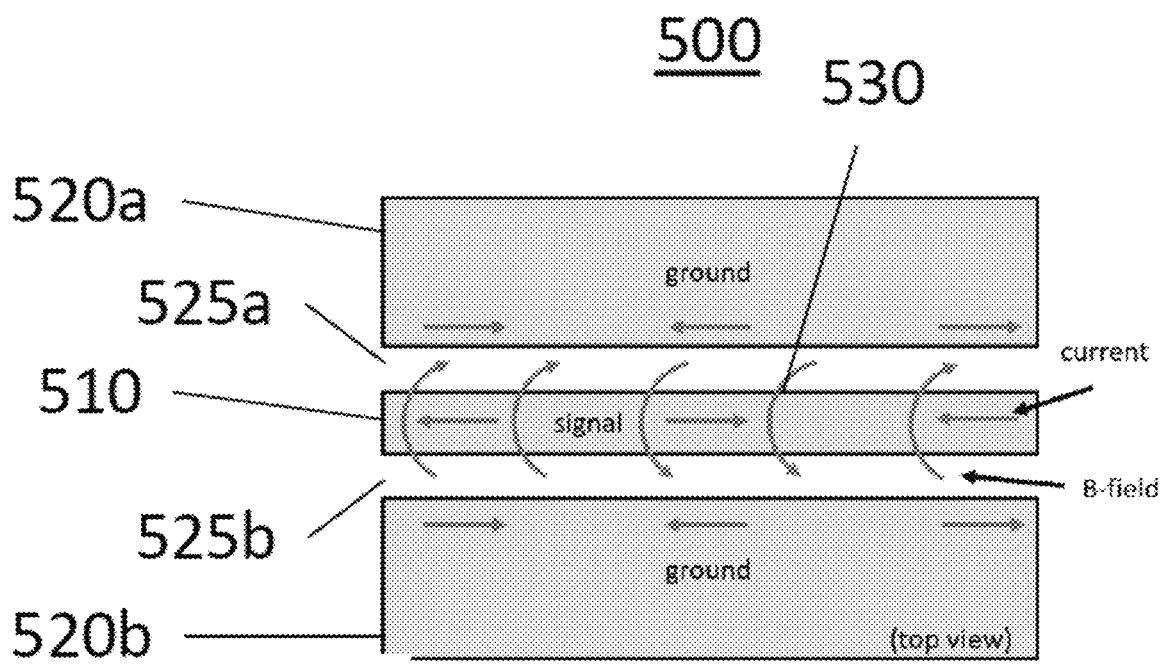

FIG. 5A illustrates a top view of a coplanar waveguide (CPW) without flux squeezing. The center conductor is a "signal" line and the other two are "ground" lines. Straight arrows represent the direction of currents, and curved arrows represent the magnetic field lines. An electromagnetic wave propagates oscillating in space and time, changing current direction every half wavelength.

Figure 5B:
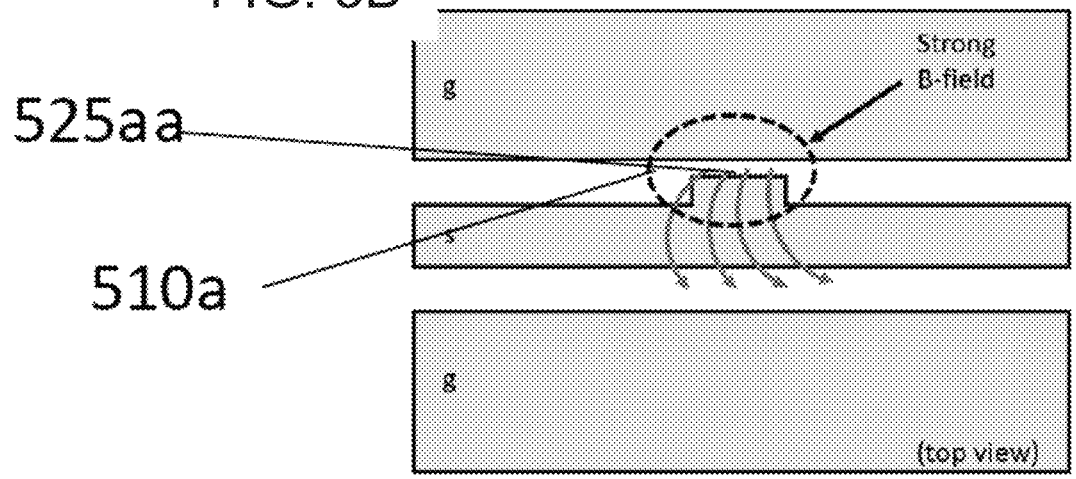

FIG. 5B illustrates flux squeezing in a CPW. The signal line is extended to reduce the gap between the signal line and the ground line. Magnetic flux that normally spreads out in a wide gap is squeezed in a smaller gap, increasing field strength.

FIG. 5C illustrates a transmission line cavity based on CPW geometry without flux squeezing. A cavity can be formed by a disconnected signal line floated in the gap between the ground lines. The length of the cavity is integer multiples of the half wavelength of the electrical signal in the transmission line, which is typically smaller than the half wavelength in free space. When the signal line length is a half wavelength as illustrated, maximum flux is observed at the center of the signal line. The cavity can be coupled with a feed-waveguide either capacitively as illustrated, or inductively.

FIG. 5D illustrates flux squeezing with a cavity. The signal line in the cavity is extended at the center region to reduce the gap size.

Figure 6A:
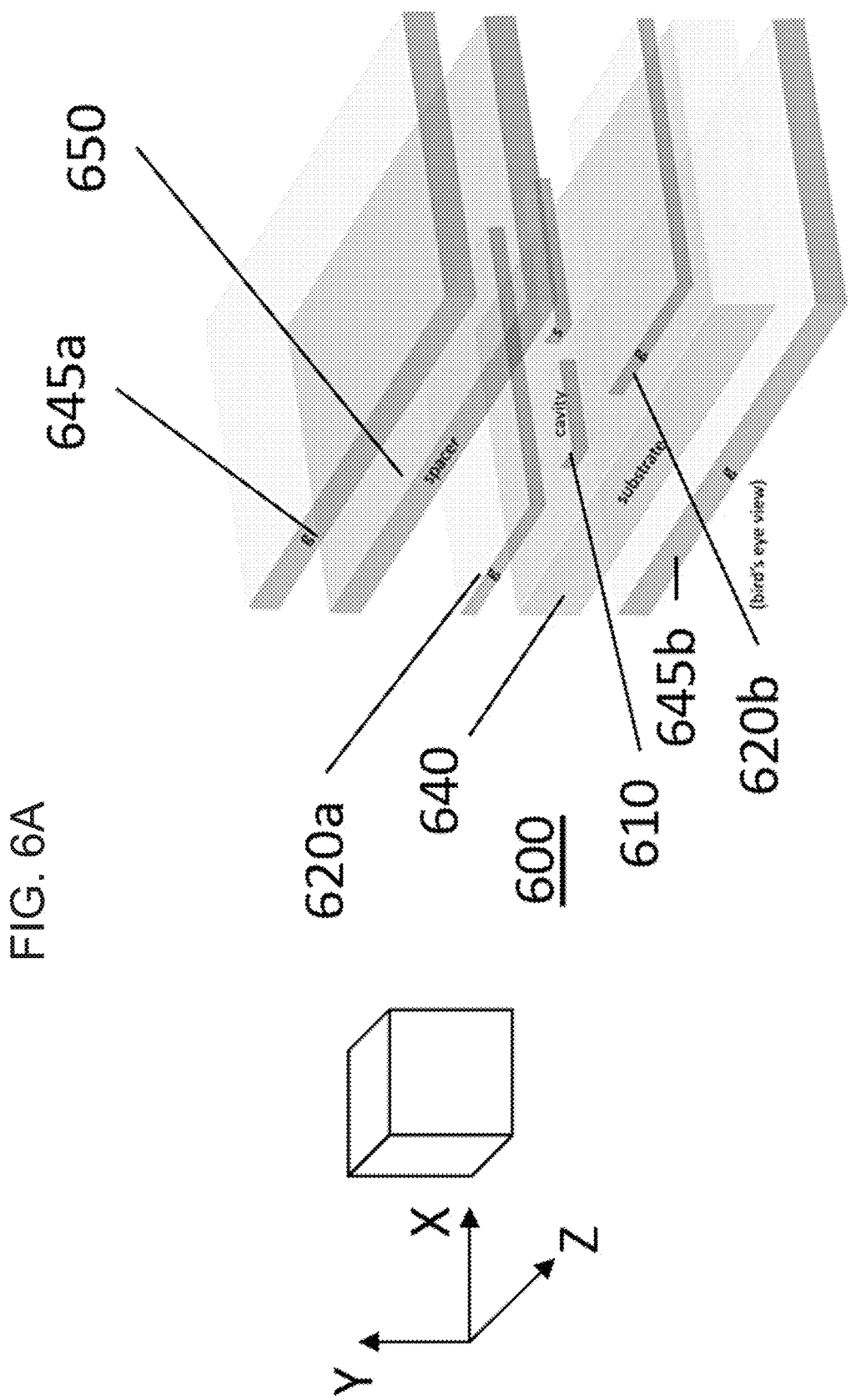

FIG. 6A is a 3D perspective, exploded view of a coplanar waveguide/cavity geometry for vertical flux squeezing. The coplanar waveguide sits on the dielectric substrate, with top and bottom ground layers. The waveguide and ground layers can be made of a superconducting material. Either or both top and bottom ground layers can provide flux squeezing for the cavity/waveguide as described.

Figure 6B:
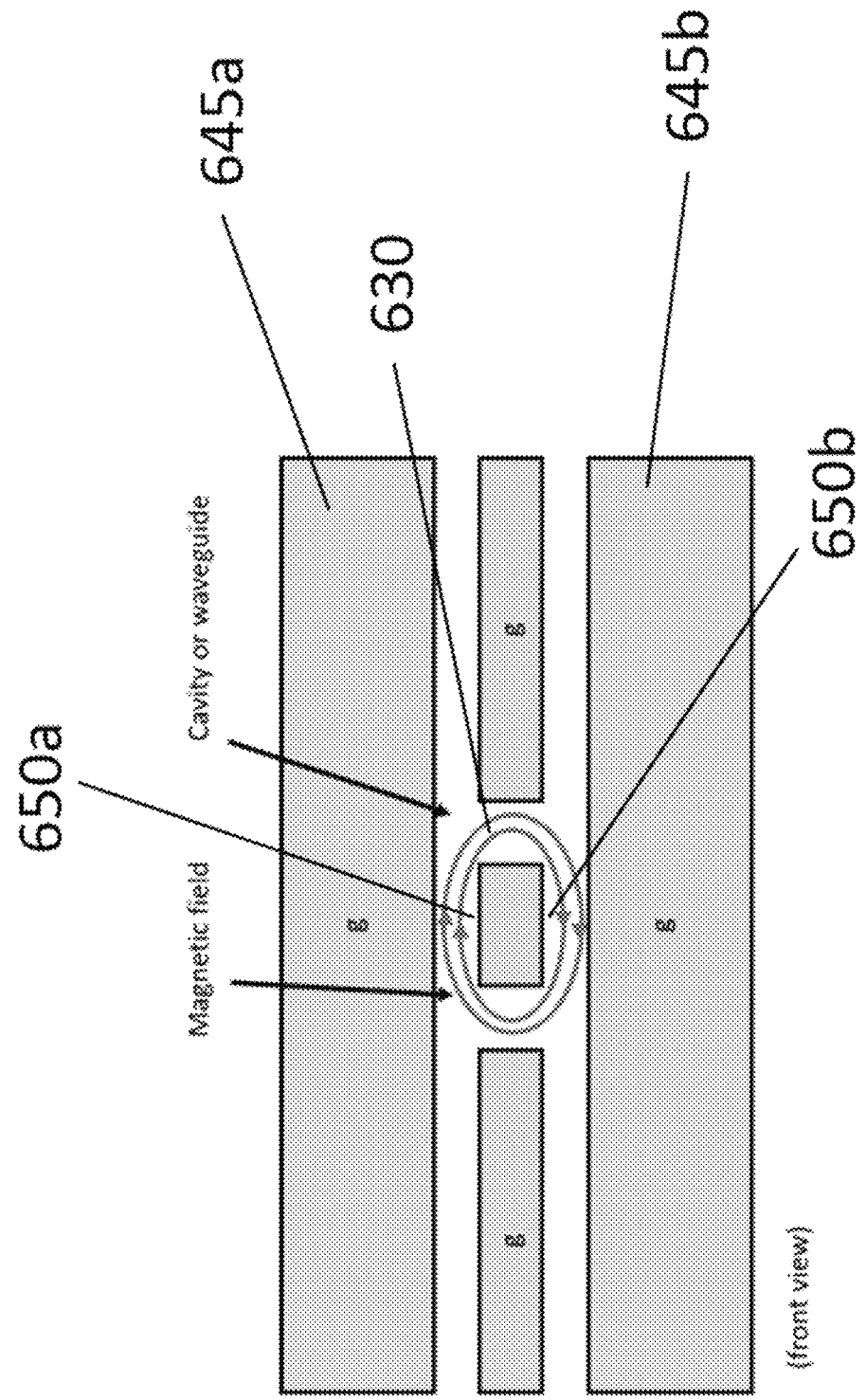

FIG. 6B illustrates a front view of the geometry of FIG. 6A. The arrows represent magnetic field lines, and higher flux density implies higher magnetic field strength.

FIG. 6C illustrates vertical flux squeezing. Here, the top ground plane/layer is used for flux squeezing. The gap between the top ground plane/layer and the signal plane/layer can be adjusted. The Y-axis is exaggerated for the visibility. The inset shows the concentrated magnetic field lines at the gap, and shows vertical flux squeezing.

Figure 7A:
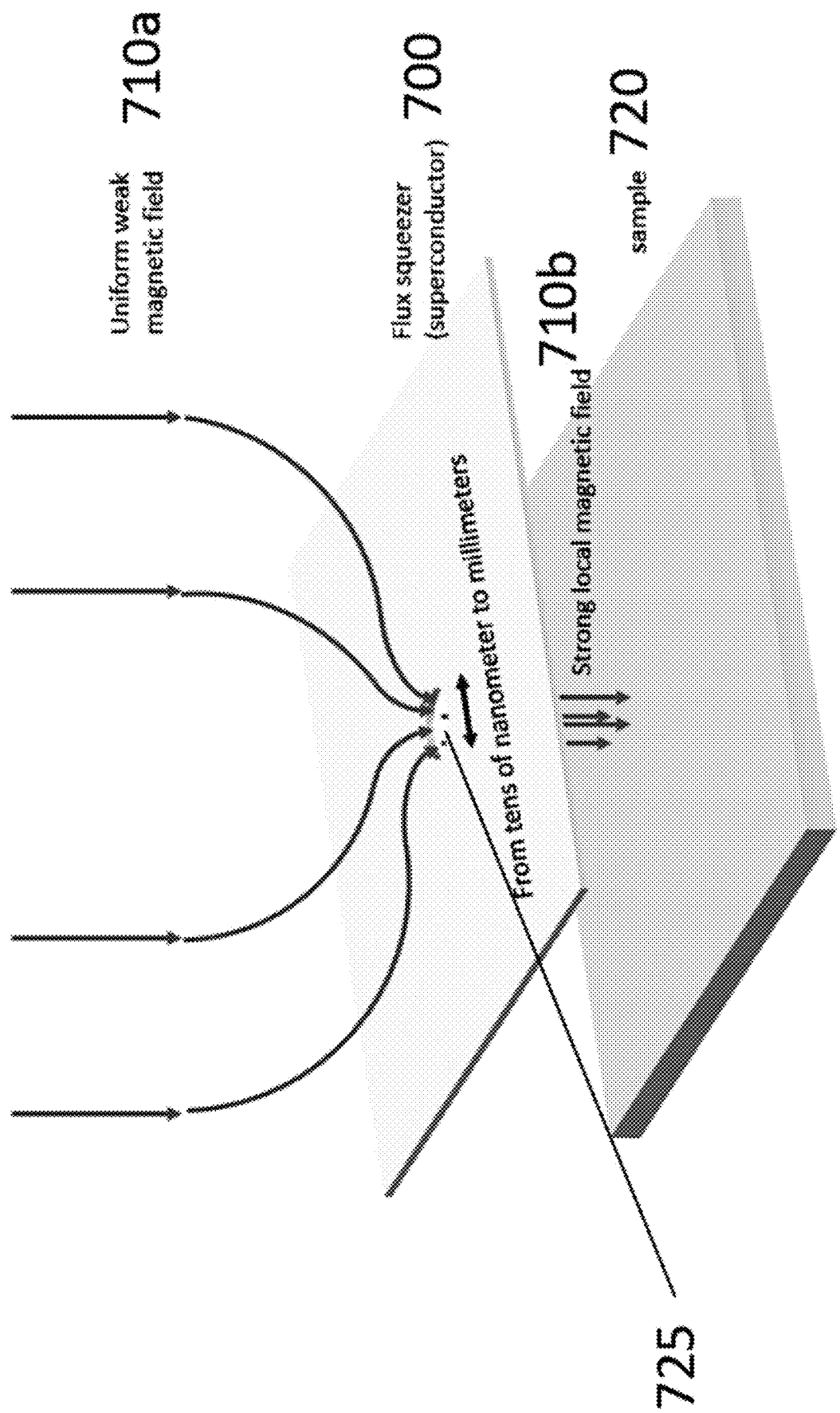

FIG. 7A illustrates a scanning apparatus for local magnetic field enhancement.

Figure 7B:
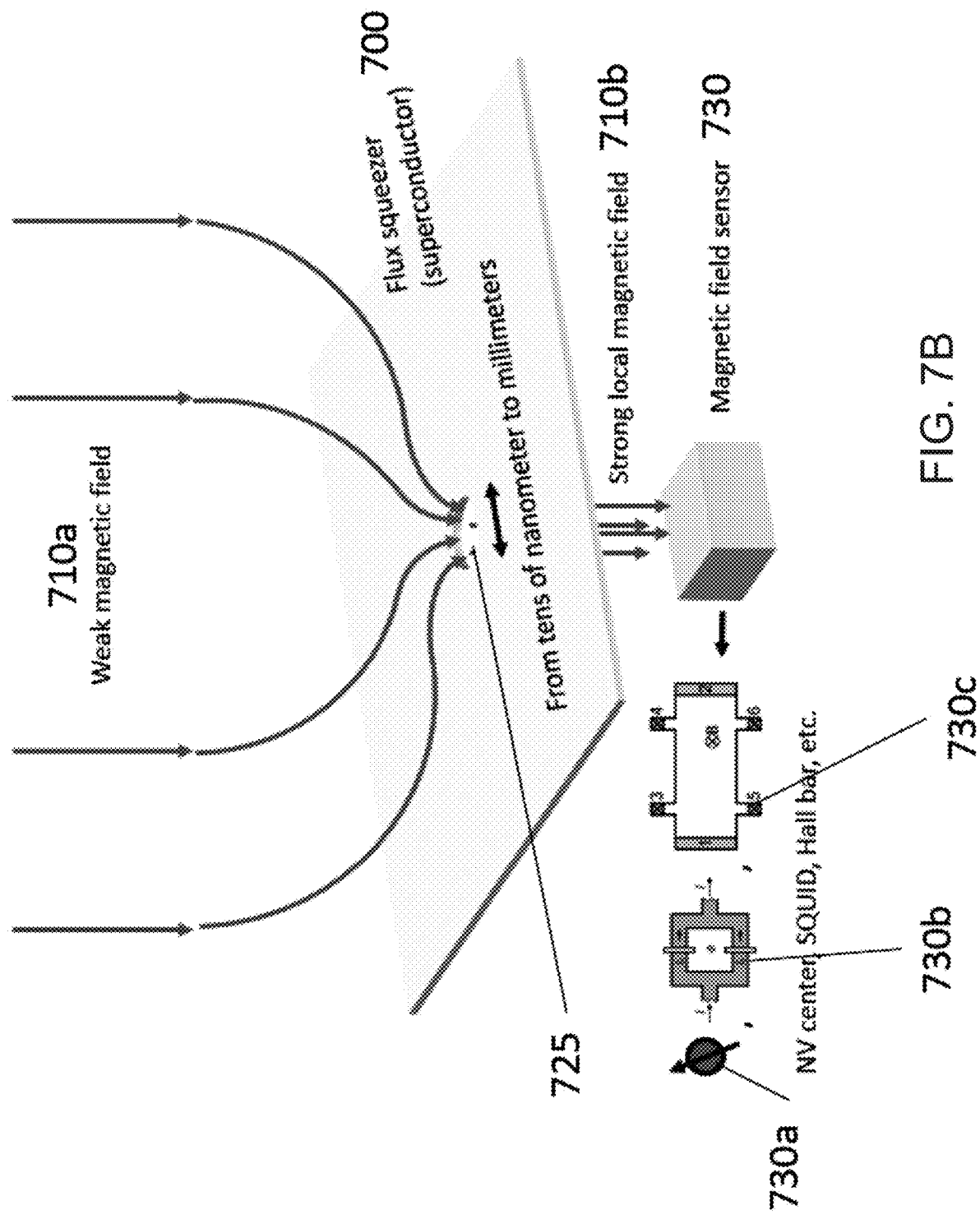

FIG. 7B illustrates an apparatus for enhanced magnetic field sensing.

Figure 8:
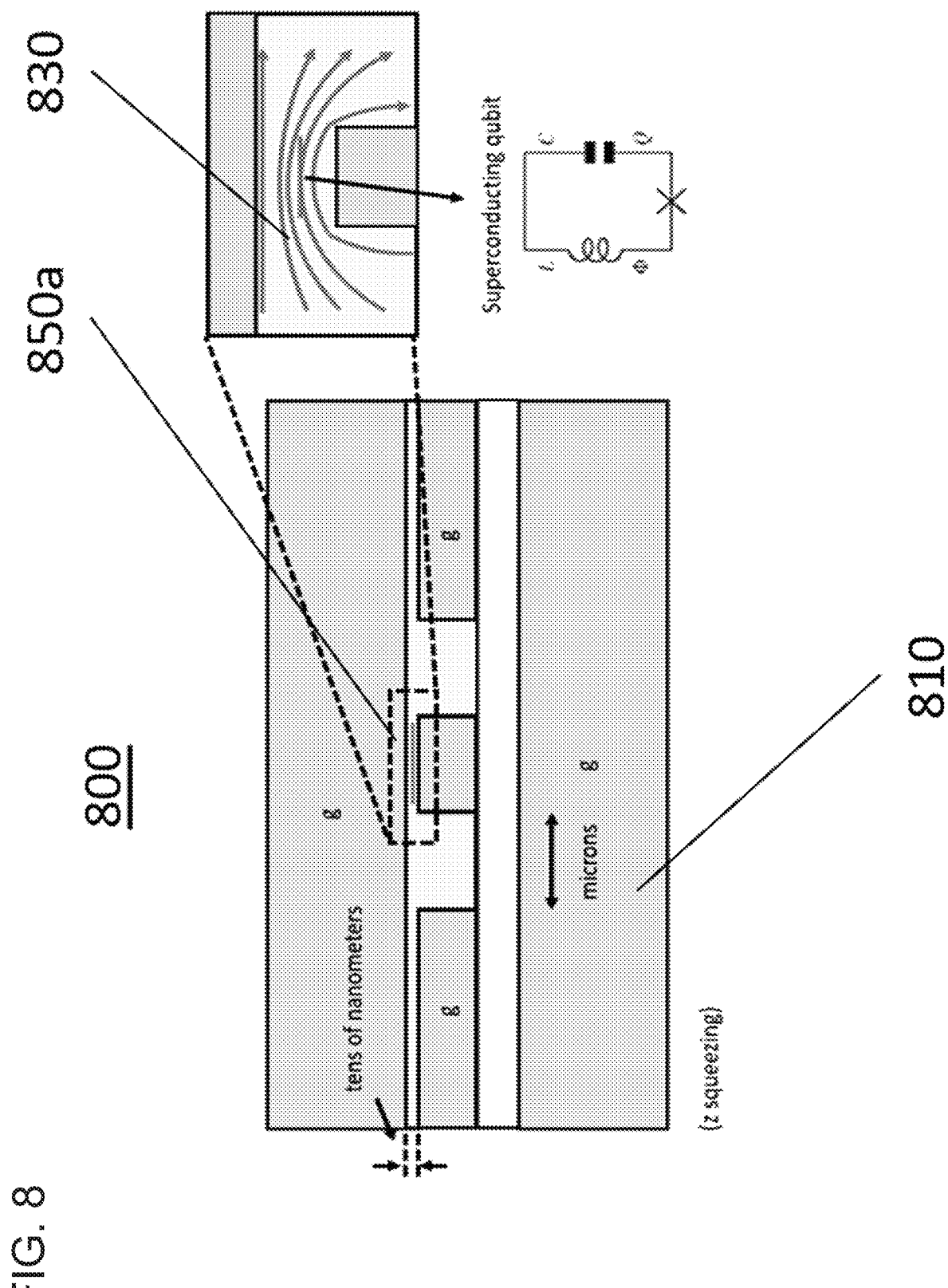

FIG. 8 illustrates a magnetic circuit quantum electrodynamic (cQED) setup.

Figure 9:
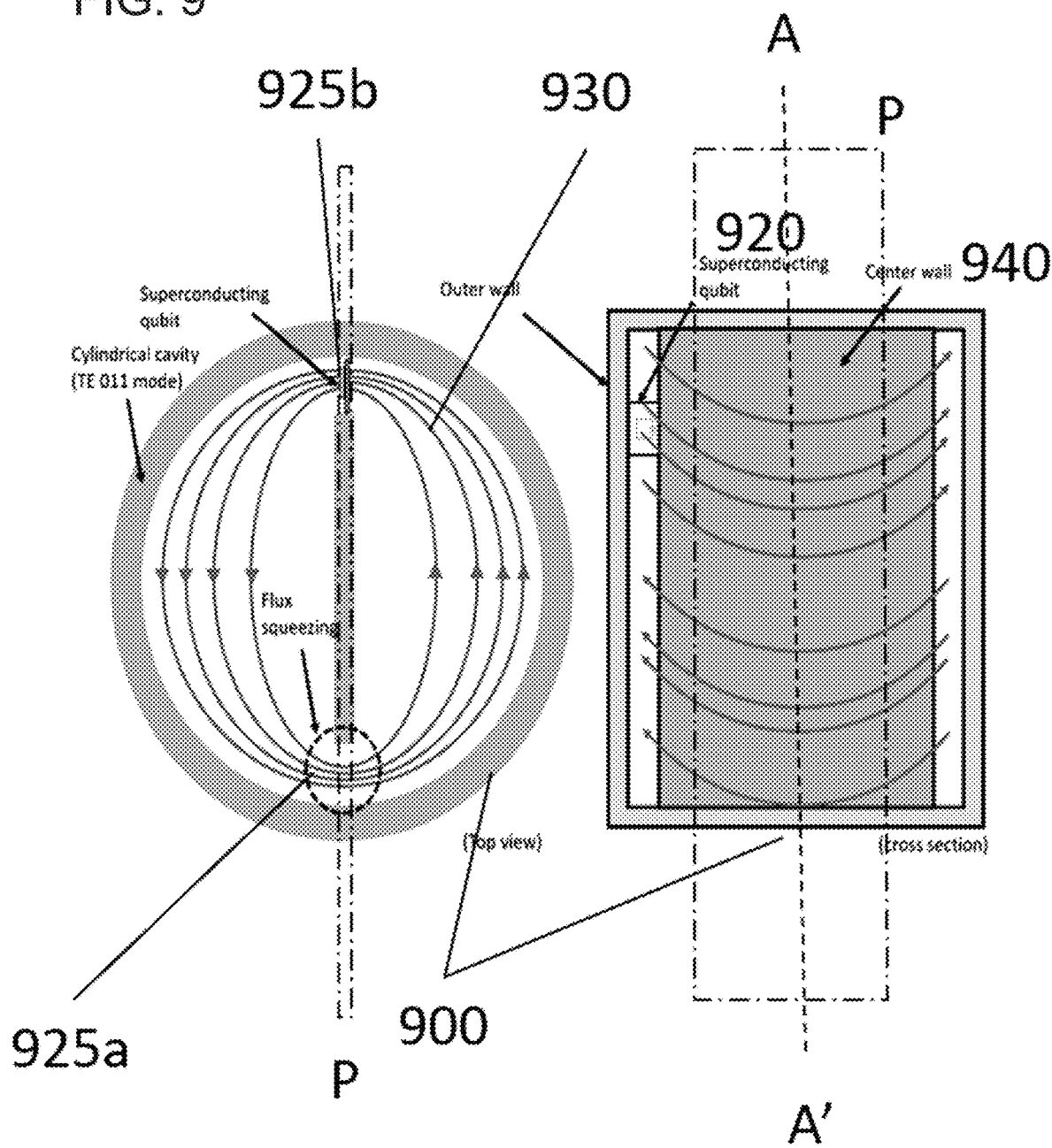

FIG. 9 illustrates another magnetic circuit quantum electrodynamic (cQED) setup.

Figure 10A:
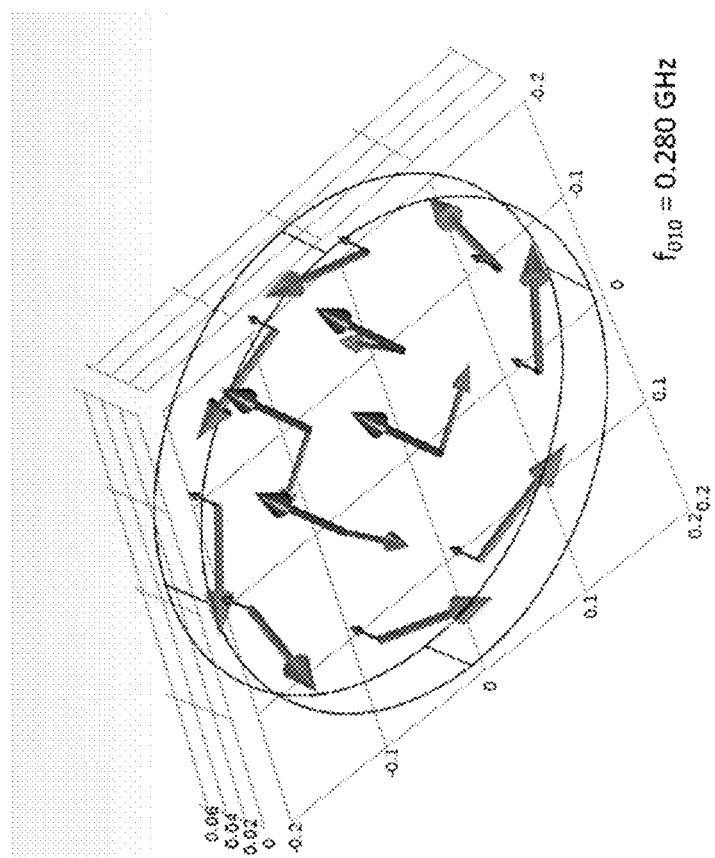

FIG. 10A illustrates a $TM_{010}$ mode in a cylindrical cavity for ultra-strong light-matter interaction. The length of the cavity is 0.2 m. The resonant frequencies is 0.280 GHz.

Figure 10B:
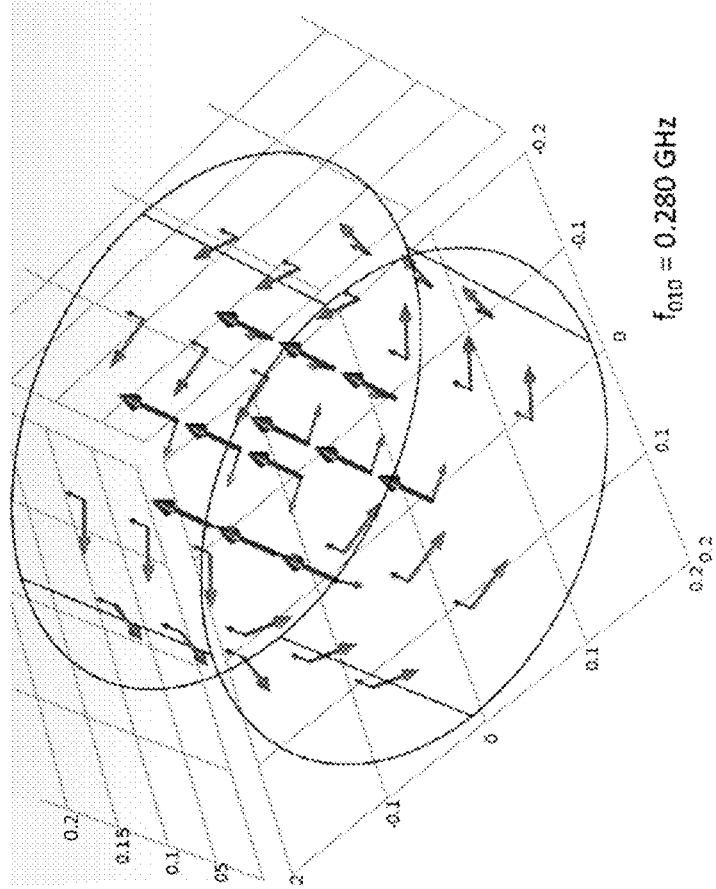

FIG. 10B illustrates a $TM_{010}$ mode in a cylindrical cavity for ultra-strong light-matter interaction. The length of the cavity is 0.05 m. The resonant frequencies is 0.280 GHz.

FIG. 11A illustrates a modified cavity design for small samples of a longitudinally squeezed $TM_{010}$ mode. The shaded map indicates magnetic field strength.

Figure 11B:
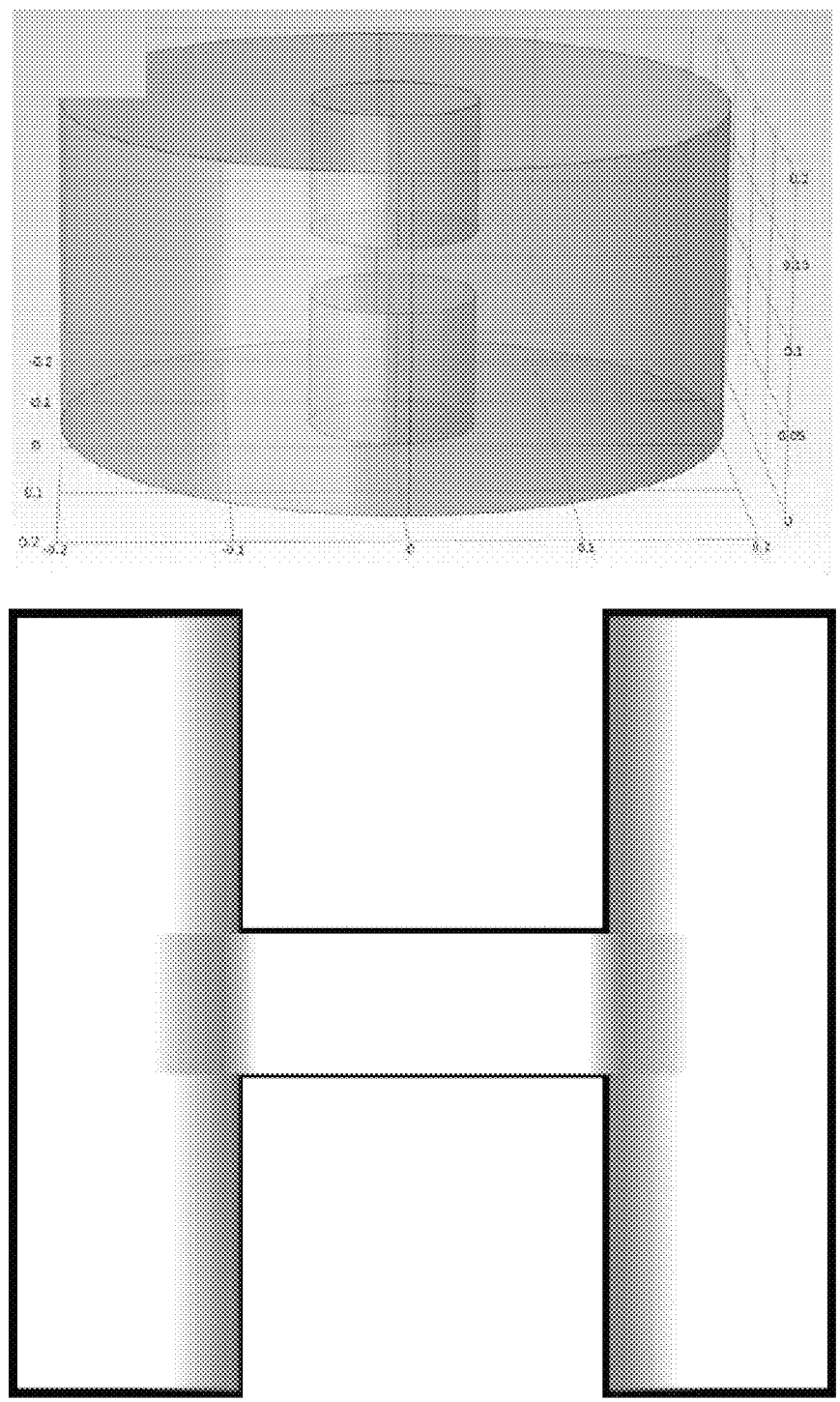

FIG. 11B illustrates a modified cavity design for small samples of a double split mode cavity. The shaded map indicates magnetic field strength. It can also be considered a loop-gap cavity or modified $TM_{010}$ mode.

FIG. 11C illustrates a modified cavity design for small samples of a re-entrant cavity. The shaded map indicates magnetic field strength.

FIG. 11D illustrates a modified cavity design for small samples of a double re-entrant cavity. The shaded map indicates magnetic field strength. Currents in the two metallic pillars are in opposite direction as in the $TM_{110}$ mode.

Figure 12A:
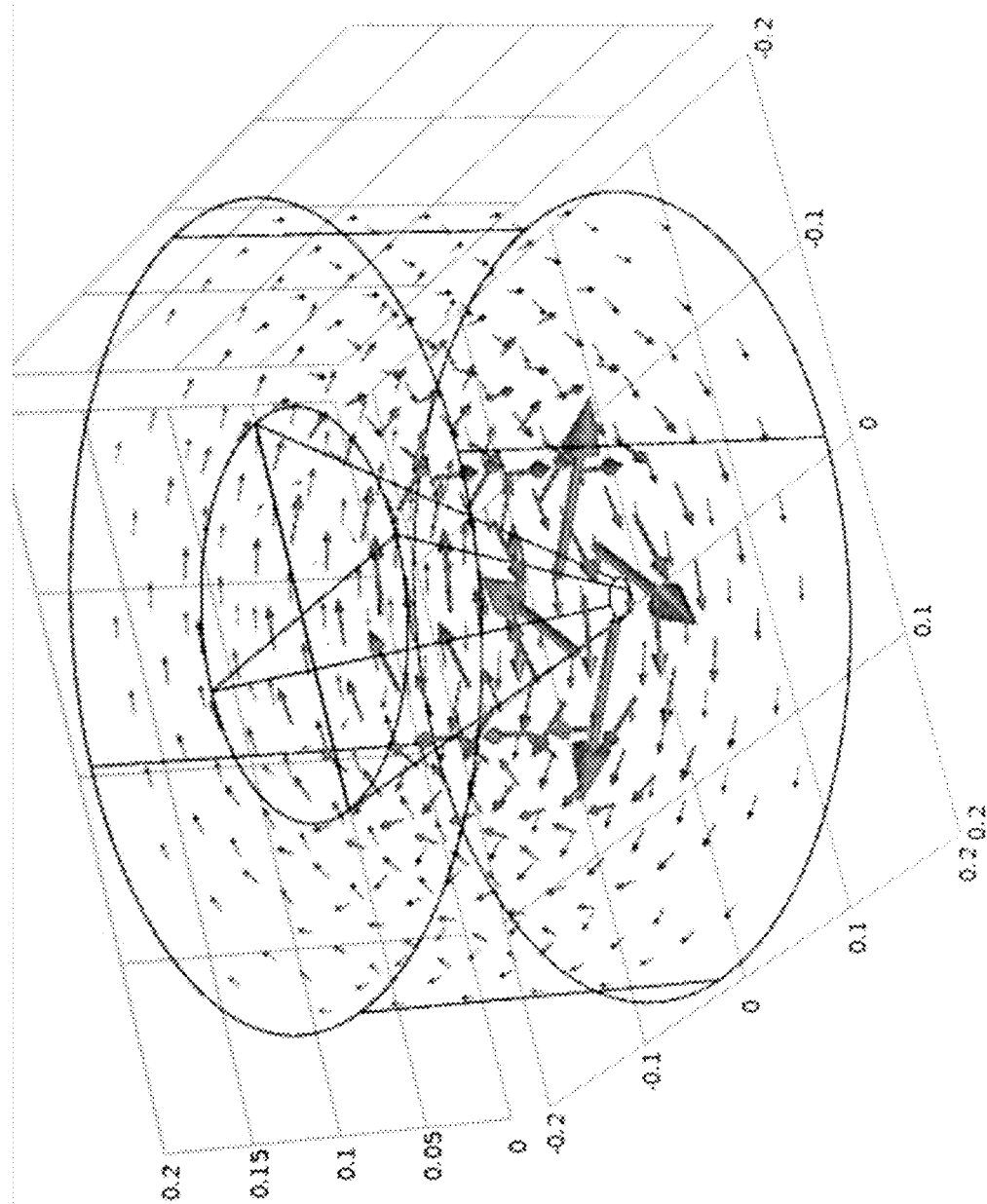

FIG. 12A illustrates current engineering to further reduce the mode volume in a re-entrant cavity. In FIG. 12A the pillar is tapered to achieve a large capacitance and a high current density simultaneously.

FIG. 12B illustrates a side view of the magnetic field distribution (magnitude) in the cross section of the pillar of FIG. 12A.

FIG. 12C illustrates a top view of the magnetic field distribution (magnitude) in the cross section of the pillar of FIG. 12A.

Figure 12D:
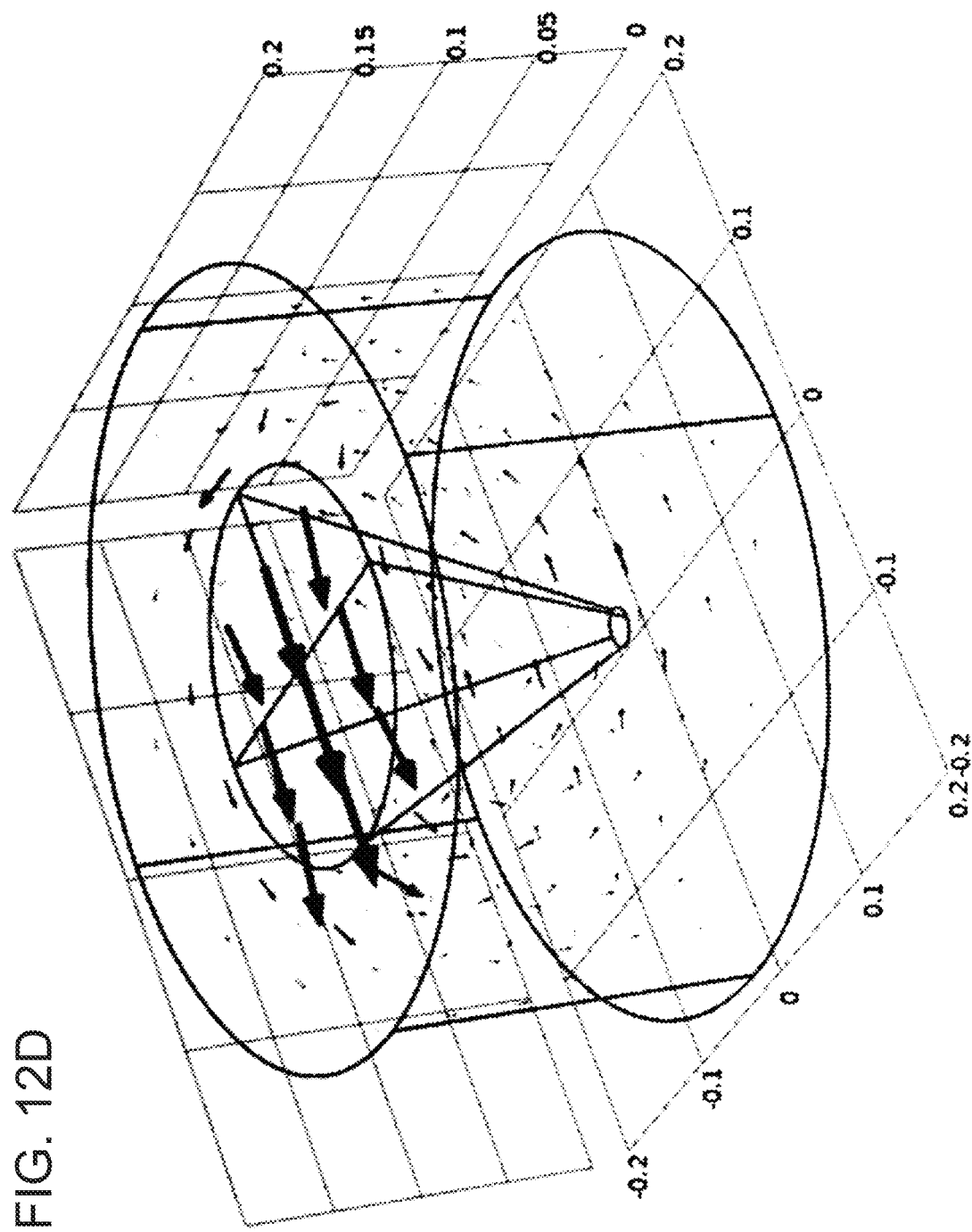

FIG. 12D illustrates a higher-order mode (compared to FIG. 12A) that has a uniform large magnetic field within the gap between the pillar and the top plate.

FIG. 12E illustrates a side view of the magnetic field distribution (magnitude) in the cross section of the pillar of FIG. 12D.

FIG. 12F illustrates a top view of the magnetic field distribution (magnitude) in the cross section of the pillar of FIG. 12D.

Figure 13A:
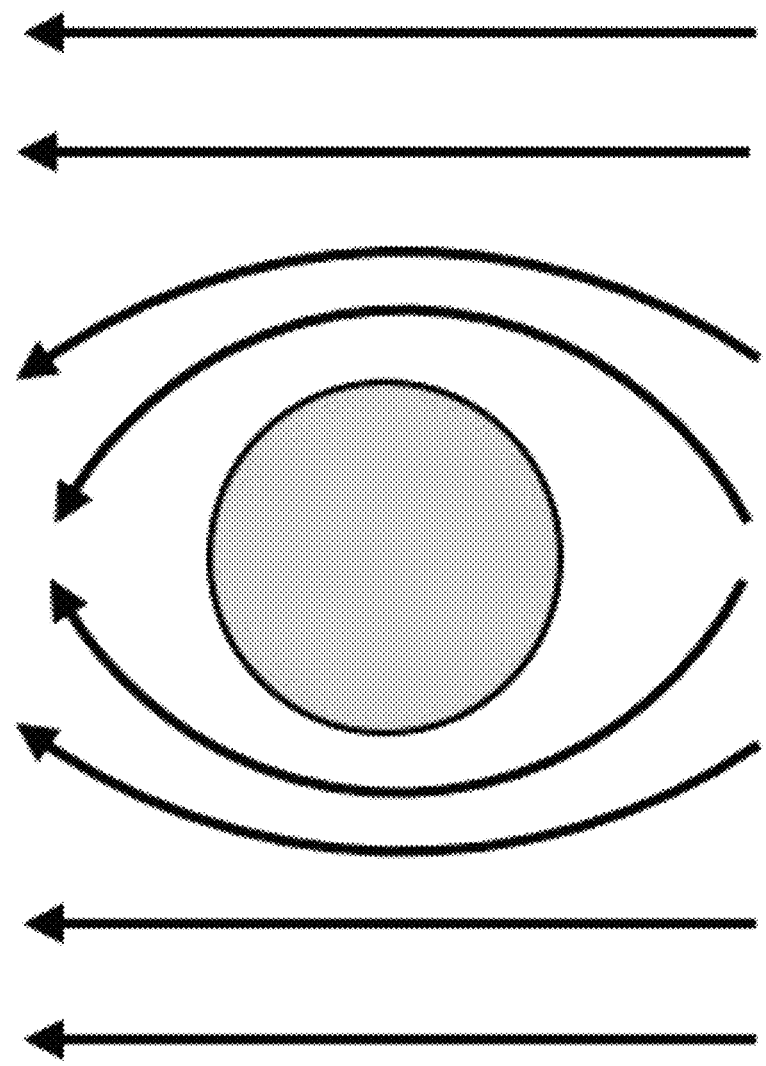

FIG. 13A illustrates the magnetic field expulsion around a sphere.

Figure 13B:
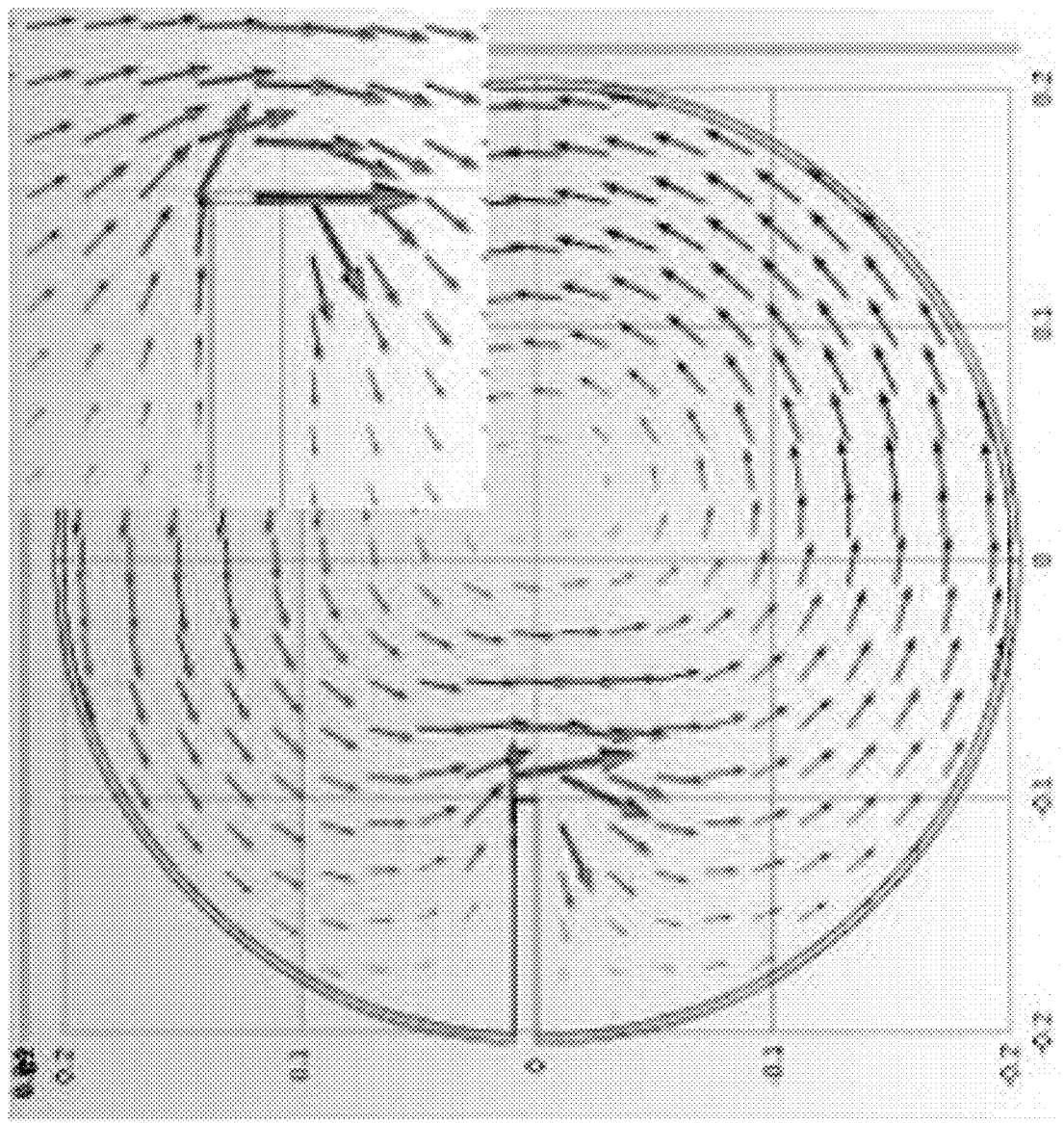

FIG. 13B illustrates the field distribution in a cylindrical cavity resonator including the field expulsion component within for flux squeezing.

Figure 13C:
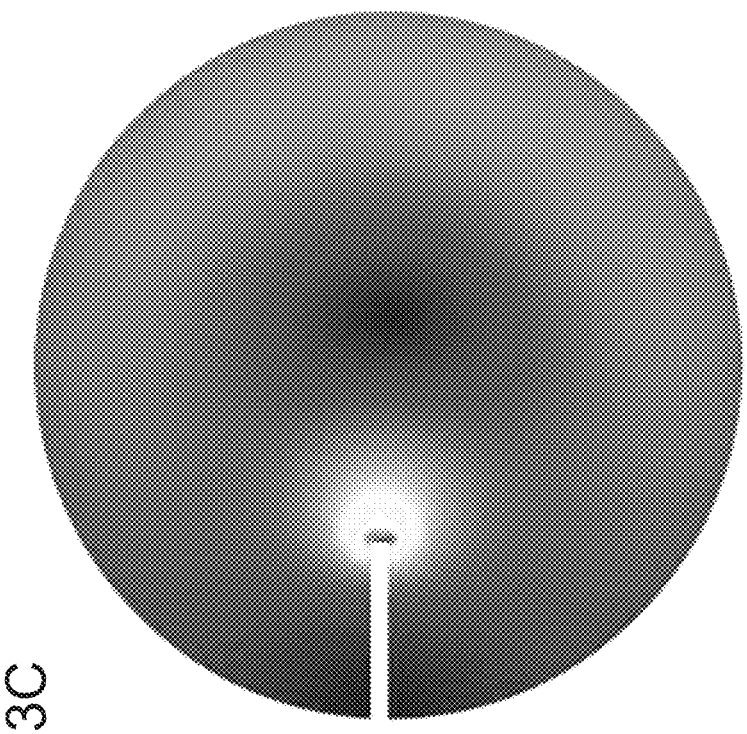

FIG. 13C illustrates the magnitude of the field in the resonator of FIG. 13B.

DETAILED DESCRIPTION

Using the Meissner effect in superconductors, demonstrated here is the capability to create an arbitrarily high magnetic flux density (also sometimes referred to as "flux squeezing"), which can find application in technologies requiring or desirous of high magnetic fields such as nuclear magnetic resonance (NMR), magnetic resonance imaging (MRI), etc. The term "Meissner Effect" characterizes the expulsion of a magnetic field from a superconductor during its transition to the superconducting state, when it is cooled below its critical temperature $T_c$. In its Meissner state, a superconductor has little or no magnetic field within it.

Figure 1:
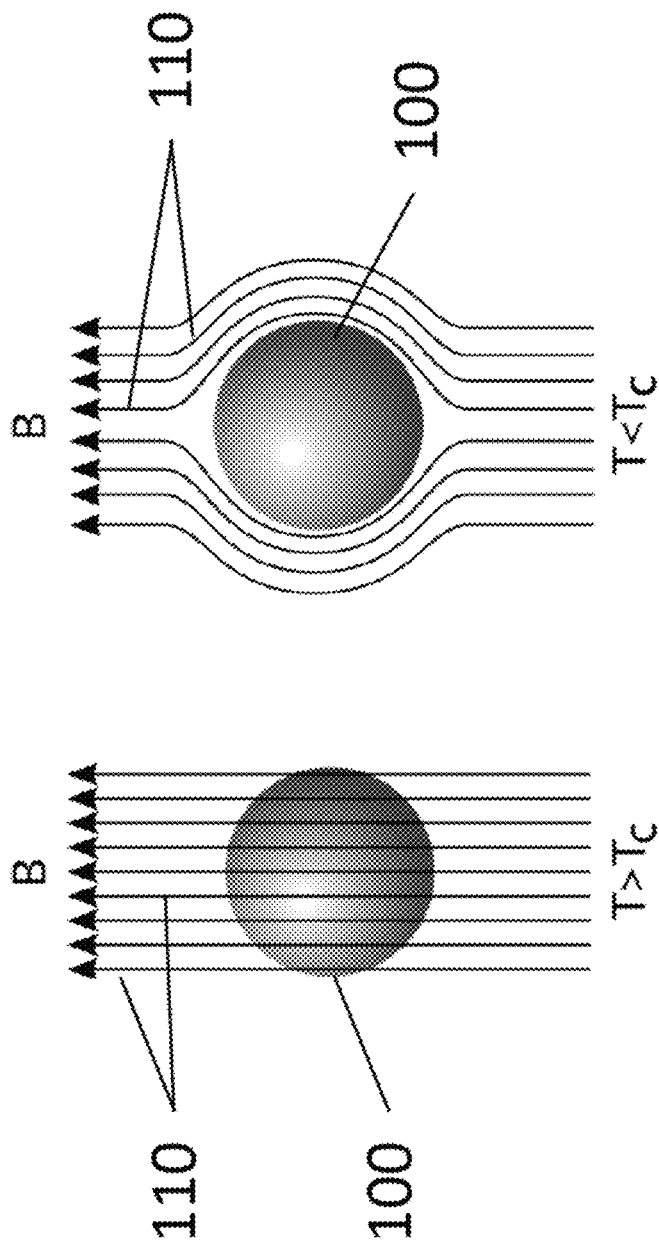
FIG. 1A illustrates the Meissner effect, and specifically illustrates a normal material when not in its superconducting state. In this state, the material does not expel the magnetic field.
FIG. 1B illustrates the material of FIG. 1A in its superconducting state. The magnetic flux is expelled around the material, causing an increase in the magnetic flux density.

Without being bound by any theory in particular, an ideal superconductor can be uniquely characterized by perfect conductivity and perfect diamagnetism, which results in a persistent superconducting current and the Meissner effect, respectively. FIGS. 1A and 1B illustrate the Meissner effect in an example material 100, shown in a generally spherical form, capable of achieving a superconducting state. When the material 100 is above the critical temperature ($T_c$), it is in the normal state (i.e., not superconducting), and the magnetic field 110 penetrates the bulk of the material 100, as illustrated by the field lines in FIG. 1A. If the temperature is below $T_c$, the material 100 is in the superconducting state (see FIG. 1B) and the external magnetic field 110 is expelled from the bulk of the material 100. The extent of magnetic field expulsion is based on the properties of the material 100, and can determine a penetration depth of the field 110 into the material. Due to the expulsion of the magnetic field, the magnetic flux density B(r), which is proportional to the magnetic field H(r), at a position r near the superconductor increases. B(r) is a three-dimensional vector. This increase is illustrated by the increased density of magnetic flux lines 100 around the periphery of the material 100, as illustrated in FIG. 1B.

Said another way, when the material 100 is in the superconducting state, the field 110 has a characteristic penetration depth into the material 100, and some magnetic field strength exists at the surface of the material. This 'demagnetization' of the material can be characterized by a 'demagnetization factor', which is generally a measure of the extent of field repulsion, can be based on the geometry and/or the shape of the material 100, and in turn can determine the magnetic field strength at the surface of the material 100. More specifically, the demagnetizing factor, $\eta$ describes and/or characterizes the relationship between the shape of the material 100 in superconducting state (in FIG. 1B) and the magnetic field 110 around it. The maximum magnetic field at the material 100 can be denoted by $H_{max}=H_c/(1-\eta)$, where the scalar notation $H_c$ refers to the magnitude of the vector field B(r). For example, for a sphere as illustrated in FIGS. 1A and 1B, $\eta=\frac{1}{2}$; for a thin cylinder (e.g., a cylinder whose cross-sectional diameter is greater than its length, which in turn is greater than the penetration depth) or plate parallel to the field, $\eta=\frac{1}{3}$; and for a thin slab (also sometimes referred to as a superconducting element) perpendicular to the field, $\eta=1$, theoretically. More specifically, $H_c$ is the critical magnetic field, and the maximum magnetic field permissible at the surface of the material 100 to maintain its superconducting state. When the field 110 exceeds $H_c$, the material 100 is no longer superconducting. If the field 110 is smaller than $H_c$, the material 100 is superconducting and the magnetic field 110 has a penetration depth $\lambda_L$ into the material. Said another way, the material 100 can attain its superconducting state based on a combination of values for k and $T_c$. When superconducting, the penetration depth $\lambda_L$ is typically on the order of 50 nm in most metallic superconductors.

FIG. 2 illustrates a slab 200 that can be composed of, or include, a material capable of superconducting behavior. For example, the material of the slab 200 can include, but is not limited to, metals (e.g., mercury, lead), alloys (e.g., niobium-titanium, germanium-niobium, niobium nitride), ceramics (e.g., yttrium barium copper oxide, magnesium diboride), iron-based superconducting compounds/pnictides (e.g., fluorine-doped LaOFeAs), organic materials (e.g., fullerenes, carbon nanotubes), thin/2-dimensional (2D) materials such as twisted bilayer graphene, and/or the like. Generally besides superconductors, any material that can expel a magnetic field may be used. For example, a low permeability metamaterial, i.e., an engineered material (also sometimes referred to as a 'smart' material) that has sub-unity permeability in a resonance setting, can be used, especially for applications with AC magnetic fields. The AC magnetic field(s) can have a frequency from about 10 Hz to about 300 GHz, including all values and sub-ranges in between.

The slab 200 can be a thin slab, such that at least one of its dimensions is significantly smaller, lower, and/or generally has a lesser dimensional value than at least one other dimension, so that it can have a thin slab/sheet-like appearance. For example, the slab 200 thickness/height can be significantly smaller than its length and/or width. This is illustrated in FIG. 2 using the axes 225 as a reference, where the slab 200 has a length L that is significantly greater than its height H. In some cases, the ratio H/L can be about 0.1, about 0.05, about 0.001, about 0.0001, less than 0.0001, including all values and sub-ranges in between. The slab 200 can then define edges 205a, 205b that include an edge along its depth D and/or the interface defined by its depth D and height H. While illustrated here as flat edges the edges 205a, 205b can take other forms such as curved, multi-faceted, etc. During use, the edges 205a, 205b are positioned perpendicular to flux density/magnetic field 210, as illustrated in FIG. 2. When the slab 200 is below the critical temperature ($T_c$) for its composition, it can achieve a superconducting state by virtue of the lowered temperature, and expel the field 210. Due to the expulsion, a portion of the field 210 forms a diverging field pattern 215 at and near the edges 205a, 205b, as best illustrated in FIG. 2. The inset plot 220 conceptually illustrates how the field 210 decays from the edges 205a, 205b towards the interior of the slab 200 such as, for example, along the length L.

In this manner, due to the Meissner effect, magnetic fields can be locally enhanced and/or otherwise affected by the shape of a superconducting material/structure placed in the field. This is applicable across the frequency spectrum, from direct current (DC) to microwave alternating current (AC) magnetic fields. When the superconducting structure is significantly smaller than the wavelength of the magnetic field (e.g., the ratio of the smallest dimension of the superconducting structure to the wavelength can approach or be the quasi-static limit, and/or can be about 0.1, or less then 0.1, including all values and sub-ranges), the magnetic field can be approximated to be substantially spatially uniform (e.g., as a quasi-static approximation) around the superconducting structure. In this manner, a freely propagating AC magnetic field can be enhanced in the same way as a DC field.

Consider a confined AC magnetic field in a resonator, a useful component for many systems and applications. FIGS.

3A and 3B are cross-sectional views of a simulated 3D cylindrical microwave resonator/enclosure 300, and plot a magnetic field (H(r)) 310 in the resonator. In some cases, an apparatus can include the enclosure 300 and a source 305 of the magnetic field as illustrated in FIG. 3A. The source 305 can be any suitable component such as, for example, a microwave signal generator injecting electromagnetic energy into the resonator 300.

In a typical resonator that includes a metallic box-like structure with inner walls composed of a (super)conductor and/or maintained in a superconducting state during operation, the magnetic field of the confined modes is substantially uniformly distributed within the volume $V_m \sim \lambda^3$, where $\lambda$ is the wavelength of electromagnetic field 310 in the dielectric filling medium inside the resonator 300. When the resonator 300 is driven with fixed input power (e.g., from any suitable incoming signal, such as that received by a mobile phone from a cell tower), the energy stored in the resonator is proportional to the quality factor (Q), and the energy density is proportional to $Q/V_m$. The energy density spatially varies in proportion with the square of the magnetic field 310. Assuming the magnetic field 310 is rather uniform, the maximum energy density is thus on the order of $Q/V_m$.

FIGS. 4A-4D illustrate a simulated 3D cylindrical microwave resonator 400, which can be structurally and/or functionally similar to the resonator 300. Similar to the resonator 300, inner walls of the resonator 400 can be composed of a (super)conductor and/or maintained in a superconducting state during operation. In some cases, an apparatus can include the enclosure 400 and a source (e.g., similar to the source 305) of the magnetic field. The resonator 400 has walls 400a, 400b, 400c, 400d as illustrated. Also illustrated are finite element method (FEM) simulations of a magnetic field 410 present in the resonator 410. In some cases, an apparatus can include the resonator 400 and a source (not shown) of the magnetic field. The resonator 410 includes two thin, superconducting slabs 420a, 420b inserted as illustrated, between the walls 400a and 400c. Each slab 420a, 420b can be constructed, sized and positioned perpendicular to the magnetic field 310 to create regions of magnetic field expulsion, in a manner similar to that described for FIG. 2. The slabs 420a, 420b can be positioned in electrical isolation from each other, to prevent electrical shorting between them.

FIG. 4A illustrates the direction $B(r)/|B(r)|$ of the magnetic field 410. As illustrated, the magnetic field 410 is substantially forced through gaps 425a, 425b between the added slabs 420a, 420b and the walls 400a, 400c respectively of the resonator 400. The width of the gaps 425a, 425b can be from about $\frac{1}{10}^{th}$ to about $1000^{th}$ of any of the dimensions of the resonator 400 (e.g., of the length L, or the height H). In some cases, the width of any of the gaps disclosed here, including the gaps 425a, 425b, can be dependent on the application, the resonator shape, the frequency of operation, and/or the like. For example, the width of the gaps 425a, 425b can be about 1-5 mm for 10 MHz operation, and 10-90 μm for 10 GHz operation.

FIGS. 4B and 4C show a strongly enhanced magnetic field B(r) 410 at the gap 425a, 425b, which can be plotted as $\log(|B(r)|/\max(|B(r)|))$ and B(r), in the inset plot of FIG. 4A. By "squeezing" the magnetic field 410 through the gaps 425a, 425b in this manner, the flux density of the magnetic field 410, both in the gaps 425a, 425b, and in the vicinity of the gaps, is increased. The increase in concentration is even more apparent in the simulation shown in FIG. 4D (and as evidenced by the inset plot in FIG. 4D), where the resonator 400 has a smaller mesh than in FIG. 4A. The magnetic field 410 diverges for perfect diamagnet; for the superconductor, the limiting spatial dimension is given by the penetration depth $\lambda_L$.

In some aspects, a method for generating a magnetic field, such as that generated by flux squeezing in FIGS. 2, 3A-3B, and/or 4A-4D, can include disposing a superconductor element (e.g., the slab 420a and/or the slab 420b) in an enclosure (e.g., the enclosure 400) such that a gap (e.g., the gap 425a and/or the gap 425b) is created between an edge (e.g., the edge 205a and/or the edge 205b of the superconductor and a wall (e.g., the wall 400a and/or the wall 400c) of the enclosure.

Applications—Transmission Line Geometry

A typical electrical transmission line usually include two conductors, signal and ground. Such transmission lines can support transverse electric and magnetic (TEM) modes operating at frequencies from microwave all the way down to DC frequencies. FIG. 5A shows a coplanar waveguide (CPW) 500 that can be monolithically fabricated on a substrate (not shown), facilitating scalable integration with other apparatuses. In the CPW 500 shown in FIG. 5A, the center conductor 510 is a "signal" line (also sometimes referred to as a first conductive element) and the other two conductors 520a, 520b are "ground" lines (also sometimes referred to as second conductive elements). The signal line 510 and the ground lines 520a, 520b can be electrically isolated from each other. Both the signal line 510 and the ground lines 520a, 520b can be any suitable materials for flux squeezing (e.g., superconducting material) in the gaps 525a, 525b formed between then. Both the signal line 510 and the ground lines 520a, 520b can be disposed in the same plane (i.e., the plane of the drawing sheet), also sometimes referred to as a horizontal plane and/or a first plane. During operation, a magnetic field 530 is induced due to current flow in the signal line 510 and the ground lines 520a, 520b as illustrated.

FIG. 5B illustrates flux squeezing and/or flux density increase in the gap 525a of a CPW 500'. A portion 510a of the signal line 510 is raised, extended, and/or otherwise protrudes to reduce a width the gap 525a (sometimes referred to as a first gap) between the signal line 510 and the ground line 520a along the portion 510a, into a smaller gap 525aa having a smaller width than the gap 525a outside the portion 510a, i.e., in a remainder of the signal line 510 and/or the ground lines 520a, 520b. The gap 525a can be reduced to any suitable extent permissible by fabrication techniques. In addition or alternatively (not shown), a portion of the ground line(s) 520a, 520b can be extended into their respective gap(s) 525a, 525b to achieve the same effect. Magnetic flux 520 that spreads out in the relatively wider gap 525a (i.e., the gap between the signal and ground lines outside of the portion 510a) is instead squeezed in this smaller gap 525aa, increasing field strength locally and in the vicinity of the smaller gap. In FIG. 5B, the density of magnetic field lines 530 represents the field strength. The flux squeezing in the transmission line CPW 500' is compatible with broadband operation, from DC to microwave frequencies. While a CPW is used here as an example, any transmission line with two conductors can suitably employ this approach to enhance magnetic field strength.

FIG. 5C illustrates a CPW 500", also sometimes referred to as a transmission line cavity, based on coplanar waveguide geometry, with $\lambda$ representing the resonance wavelength. As for FIGS. 5A, 5B, a cavity/gap 525a can be formed by the signal line 510 being floated between the ground lines 520a and 520b. Here, the signal line 510 has a shorter length than the ground lines 520a and 520b. The signal line 510 is electrically coupled with a feed-waveguide/input CPW 535 (sometimes referred to as a third conductive element) either through a capacitor 540 or via an inductor (not shown). The flux is strongest at the center of the signal line 510, as illustrated by the magnetic field indicators 530. This flux can be further increasing using a flux squeezing approach applied to the center of the signal line 510, as illustrated for the CPW 500''' in FIG. 5D. For resonance, the length of the signal line 510 can be a multiple of half of the wavelength of the magnetic field 520, and can be from about ten microns to about ten centimeters, including all values and sub-ranges in between.

In FIG. 5D, similar to FIG. 5B, the signal line 510 is raised and or protrudes into the cavity/gap 525a at a portion 510a, reducing the width of the gap 525a to 525aa. In addition or alternatively, the ground line(s) 520a, 520b can be extended or protrude into the gap 525a. The increased density of magnetic field lines 530 in the gap 525aa represents a stronger magnetic field than that outside the gap 525aa. Flux squeezing with a cavity operates in a band of frequencies centered around the resonance wavelength of the cavity, but the magnetic field strength is increased to a larger extent due to the resonance in the cavity. The resonance wavelength and/or bandwidth can be cavity design dependent.

During use, an electromagnetic wave reflects back and forth between two cavity ends, and the generated magnetic field interferes with itself. The enhancement factor for this design, compared to its corresponding CPW design (e.g., of the design in FIG. 5C relative to that in FIG. 5A, and/or the design in FIG. 5D relative to that in FIG. 5B), can be based on the number of reflections of the electromagnetic wave in the cavity before it leaks or dissipates, also characterized as the finesse of a cavity. The enhancement factor of the designs employing flux squeezing can be from about 10 to about 1000, and/or increased by a factor of about 10 to about 1000 relative to the corresponding CPW design.

The flux squeezing of FIGS. 5A-5D can generally be considered 'horizontal' flux squeezing, with both the signal line 510 and the ground lines 520a, 520b lying in the same plane. FIGS. 6A-6C illustrate 'vertical' flux squeezing in CPWs, which can be employed separately or simultaneously with horizontal flux squeezing. FIG. 6A illustrates a coplanar waveguide 600 that includes and/or is formed on a dielectric substrate 640. The CPW 600 includes a cavity and/or waveguide (e.g., a signal line) 610 with side ground lines/layers 620a, 620b that can be similar to the ground lines 520a, 520b. As explained for FIGS. 5A-5D, the signal line 610 and the ground lines 620a, 620b can lie in the same plane, e.g., the XZ plane illustrated for FIG. 6A. The waveguide 600 also includes a top group layer 645a, and a bottom ground layer 645b, each of which lie in parallel XZ planes relative to the plane of the signal line 610 and the ground layers 620a, 620b, and relative to each other, but at different heights, along the Y axis.

Also illustrated is an optional spacer 650. The waveguide 610 and the ground layers 620a, 620b, 645a, 645b can be made of any suitable superconducting material. By selective positioning of the layers 645a, 645b, either or both these layers can provide flux squeezing for the cavity/waveguide 610.

FIG. 6B generally shows the magnetic field lines in a front view. Arrows 630 represent magnetic field lines, and higher density in the gaps 650a, 650b between the waveguide 610 and the layers 645a, 645b respectively implies higher magnetic field strength.

FIG. 6C illustrates vertical flux squeezing in the gap 650a by virtue of a narrower/smaller gap region 650aa between the waveguide 610 and the layer 645a, relative to the gap between the waveguide 610 and the layer 645b. The width of the gap region 650aa can be selected based on any suitable criterion laid out herein (e.g., frequency of operation, specific application, fabrication considerations, etc.). In some cases, the gap region 650aa can have a width from about 10 nm to about 5 mm, including all values and sub-ranges in between. Here, the top ground layer 645a is used for flux squeezing, but the bottom layer 645b can be also used. The gap between the ground layer 645a and the waveguide 610 can be adjusted for applications from nanometers to hundreds of nanometers (Y-axis is exaggerated for the visibility). The inset shows the concentrated magnetic field lines 530 at the gap region 650aa due to vertical flux squeezing.

Applications—Scanning Apparatus for Local Magnetic Field Enhancement

There are many applications where a strong magnetic field such as, for example, over 1 Tesla, is desirable. This includes modern condensed matter experiments, such as those studying or employing quantum Hall effects. Currently, such strong magnetic fields can be created using permanent magnets and/or electromagnets. Electromagnets can be tuned to create stronger magnetic fields than permanent magnets, sometimes using superconductors to avoid heating issues. However, heating from ohmic loss (normal metals) and the critical field of the superconductor can limit the strength of the magnetic field so created.

Flux squeezing can be employed to create desirable, high magnetic fields locally. FIG. 7 illustrates an apparatus 710 to generate, from a lower flux magnetic field 710a, a higher flux magnetic field 710b, which can be collimated as illustrated, or have some minor spread if desired, prior to application to a sample 720. The apparatus 700 can be configured as a superconducting flux squeezer that is placed in a plane perpendicular to the magnetic field lines, to squeeze the magnetic flux 710a into a smaller region/footprint. The flux squeezer can be, as illustrated, a superconducting plate with single hole/orifice 725 or multiple holes/orifices. The size of the hole(s) 725 can be determined by the target resolution of the application, and can be from about ten nanometers to about five millimeters in diameter, including all values and sub-ranges in between. The smallest possible resolution can be determined by the Landau penetration depth, which can vary for different superconductors, and may be in the range of tens of nanometers. The apparatus 700 can be used with both DC and AC magnetic fields, and can be integrated with scanning techniques such as atomic force microscopy (AFM), scanning tunneling microscopy (STM) tip-assisted optical microscopy, Raman spectroscopy, and/or the like.

Applications—Enhanced Magnetic Field Sensing

Squeezing magnetic flux as illustrated in FIG. 7A can be used to detect weak magnetic fields by increasing flux density, as illustrated in FIG. 7B. Here, any type of a magnetic field sensor 730, such as a sensor using quantum spin 730a, superconducting quantum interference devices (SQUIDs) 730b, and/or Hall bars 730c can coupled to the apparatus 700 on the side of the stronger magnetic field 710b. The weak magnetic field 710a, on one side of the apparatus 700, is concentrated and detectable by the sensor 730 when appropriately positioned on the other side of the apparatus. Such flux amplification does not produce any additional noise, so the sensitivity of the sensor 730, i.e., the weakest magnetic field 710a that can be sensed, can be very low such as, for example, on the order of 1 picoT/sqrt(Hz), 1 femtoT/sqrt(Hz) or less, including all values and sub-range in between. For example, assuming a 30 cm cross-section flux squeezer apparatus 700 with a 3 mm diameter hole 725, the magnetic field/flux density 710a can be roughly enhanced by a factor of about 104. Thus, the sensitivity of the sensor 725, when the sensor is a NV-based magnetometer, can be as low as about 30 femto-tesla per square Hertz (30 fT·Hz$^{-1/2}$). Both AC and DC magnetic field sensing can be carried out with this approach.

The apparatus 700 can additionally find application for enhanced microwave spectroscopy. Electron spin resonance (ESR) and nuclear magnetic resonance (NMR) are spectroscopic approaches for detecting electron and nuclear spins in samples, respectively. There are at least three processes in these methods that can utilize the flux squeezing detailed herein:

1) Spin polarization: thermal polarization of spins increases with external (DC) magnetic field strength. Using a flux squeezer, such as that illustrated in FIGS. 7A-7B, larger magnetic fields can be created to, in turn, affect larger thermal polarization.
2) Rotating spin—microwave (MW) field interaction: Rotating spins in the sample emit an EM field that is detected. A flux squeezer, such as that illustrated in FIGS. 7A-7B facilitates this process by squeezing magnetic flux generated by such spins.
3) Detection of MW signal: A flux squeezer can be used to enhance detection of microwave signals, similar to FIGS. 7A-7B.

The apparatus 700 can additionally find application for magnetic resonance spectroscopy using statistical fluctuations in small samples. For example, consider than a sample with N uncorrelated spin-½ systems has a statistical polarization of order $1/N^{1/2}$. This polarization persists on the order of the $T_1$ time of the spins. For a small sample and for small measurement intervals, it is possible to use statistical polarization for measuring magnetic resonance, rather than having to rely on thermal polarization. The magnetic field/flux concentration approach detailed herein can allow for strong RF field generation for high-speed magnetic resonance measurements, even for small samples. This could thus allow magnetic resonance in an ultra-small, field-sized apparatus for numerous applications such as chemical analysis, airport security, and/or the like.

Applications—Superconducting Quantum Computing with Magnetic CQED

Circuit quantum electrodynamics (CQED) studies the interaction between superconducting qubits and resonator cavity electromagnetic fields. Typically, electric dipole interaction with an electric field is used because of the large strength of the electric field. However, a superconducting qubit cannot be strongly coupled with the resonator cavity due to the weak nature of magnetic coupling, even though the cavity typically has superior properties with respect to magnetic coupling as compared to electric coupling, such as larger anharmonicity, that enable faster qubit operations. Providing the cavity with a stronger local magnetic field enhances coupling between the qubit and the cavity field. Another advantage of such enhanced magnetic field coupling is that the qubits are less susceptible to noise.

FIGS. 8A and 9 illustrate setups for magnetic CQEDs. FIG. 8 illustrates, similar to FIG. 6C, a flux squeezed, transmission line resonator apparatus 810. A superconducting qubit 820 sits in the gap 850a (similar to the gap 650a). Unlike conventional transmission line geometry, vertical squeezing through Meissner's effect is used to further increase the field in the small gap 850a. Spacer deposition (not shown) before and after qubit fabrication can permit the qubit 820 to sit in the gap 850a without electrical shorting. In this geometry, the cavity magnetic field 830 is in the same plane with the qubit 820, increasing transversal interaction. While cavity-qubit coupling (e.g., similar to FIG. 5C, 5D) with flux squeezing is shown here, waveguide-qubit coupling (e.g., similar to FIG. 5A, 5B), which enables broadband operation but with relatively lower coupling strength, is also possible.

Though transmission line geometry, such as that illustrated in FIG. 8, enables monolithic cavity fabrication with a high degree of coupling, the photon lifetime can decrease due to dielectric loss. Alternatively, a 3D cavity can be used without a dielectric. FIG. 9 illustrates a cylindrical cavity 900 with a transverse mode $TE_{011}$, defining an axis A-A' and a plane P. Similar to the resonator 300, inner walls of the resonator cavity 900 can be composed of a (super)conductor and/or maintained in a superconducting state during operation.

The transverse mode $TE_{011}$ has a circular magnetic field pattern 930. The introduction of a superconducting, central wall 940 squeezes the magnetic field 930 within small gaps 925a, 925b between the superconducting wall 940 and the cavity 900, increasing the interaction between the magnetic field 930 and the qubit 920 that is disposed in the plane P and is otherwise electrically isolated from the cavity 900. Any type of 3D resonator with B-field that can be squeezed can exploit this approach.

Electrically, the transmission line geometry with two conductors can support TEM mode (with TE and TM as leakage modes), and the mode of 3D resonator with single conductor can be a TE or TM mode.

Other spin qubits, such as gate-defined quantum dots, can also be coupled with a field enhanced cavity structure as discussed above for FIGS. 8 and 9. Recent progress in the field shows that qubit properties can be dramatically improved by forbidding electronic transitions. Electronic transitions are typically employed because magnetic transitions are weaker, even though electronic transitions are susceptible to noise. By increasing magnetic transition(s), noisy electric transition(s) can be forbidden, resulting in better performing qubits.

Example 1—Ultrastrong Magnetic Light-Matter Interaction with the Field Squeezing in $TM_{nm0}$ Mode Magnetic dipoles couple to the photons' magnetic field through the interaction Hamiltonian $H_{int} = \vec{\mu} \cdot \hat{\vec{B}}$. Interaction between a single-photon and quantum spins or artificial atoms based on superconducting circuits has importance in quantum information technologies. However, the magnetic field of a single-photon is too weak, and thus, cavities with small magnetic mode volume and large quality factor (Q-factor) are essential. The effective magnetic mode volume of a cavity is $$V = \frac{\int dV \mu(\vec{r}) |H(\vec{r})|^2}{\mu(\vec{r_e}) |H(\vec{r_e})|^2}, \quad (1)$$

where $\vec{r}_e$ is the position vector of a spin.

There have been extensive studies in superconducting quantum computing communities on resonators based on coplanar waveguide geometries. Essentially, two or more isolated conductors can support TEM modes with zero cut-off frequency and transversal Laplace equation, enabling conductors to be proximate for small mode volume. However, dielectric losses limit the Q-factor forbidding applications requiring a long photon lifetime. On the other hand, there have been huge successes in 3D transmon based on the hollow cavities that can support TE or TM modes. However, their coupling rate is too low to use superconducting artificial atoms as a qubit.

Different cavities and modes for strong magnetic lightmatter interaction are disclosed here. First the longitudinally squeezed $TM_{010}$ mode with mode volume limited by skin depth is studied. Mode squeezing decreases Q-factors, but conductor loss can be mitigated by using superconductors. In addition to low loss, superconductor provides very small penetration depth even at low frequencies while skin depth of normal conductors have $1/\sqrt{f}$ dependence and large at low frequencies. When a sample cannot overlap with the high magnetic field of the mode, a cavity can be modified resulting in loop-gap resonators or re-entrant cavities that have been widely studied. Also provided is an interpretation using a LC-circuit for flexible cavity designs that is used for the cavity with further reduced mode volume. Lastly, a local field enhancement method based on the field expulsion (demagnetization) is proposed. This method shows an ultra-asmall mode volume limited by penetration depth, and thus again, superconductors are advantageous at low frequencies.

$Tm_{010}$ Mode for Longitudinal Mode Squeezing

Electromagnetic (EM) fields in $TM_{mnp}$ mode in a cylindrical hollow cavity are $$E_z = E_0 \cdot J_m(k_c r) \cdot \cos(m\phi) \cdot \cos\left(\frac{\pi p z}{l}\right) \cdot e^{i\omega_{mnp} t} \quad (2)$$

$$H_\phi = E_0 \cdot i\frac{\omega \epsilon_0}{k_c} \cdot J'_m(k_c r) \cdot \cos(m\phi) \cdot \cos\left(\frac{\pi p z}{l}\right) \cdot e^{i\omega_{mnp} t}, \quad (3)$$

where $k_c$ is the cut-off wavevector of base circular waveguide, $J_m(r)$ the Bessel function of the first kind with the order m, $\omega_{mnp} = c\sqrt{(j_{mn}/a)^2 + (p\pi/l)^2}$, a and l the radius and the length of a resonator, and $j_{mn}$ the nth zero of $J_m(r)$ Pictorially, m, n, and p represent azimuthal, radial, and longitudinal wavenumber, respectively.

Importantly, the cavity supports $TM_{nm0}$ modes of which the field is longitudinally uniform. For example, $TM_{010}$ mode has, $$\vec{E}(r) = \hat{z} E_0 \cdot J_0(j_{01} r/a) \cdot e^{i\omega_{010} t} \quad (4)$$

$$\vec{H}(r) = \hat{\phi} E_0 \cdot i\frac{\omega \epsilon_0}{j_{01}/a} \cdot J'_0(j_{01} r/a) \cdot e^{i\omega_{010} t}. \quad (5)$$

Thus, the cavity can be longitudinally squeezed without changing the cut-off frequency. For a vanishingly small cavity length, the mode volume is, $V \rightarrow 2\delta \cdot \pi r^2 \ll \lambda^3$ where $\delta$ is the penetration depth, and $\lambda$ is the wavelength of EM wave in cavity filling material. This is in striking contrast to the usual intuition that modes occupy the volume of wavelength cube ($\lambda^3$) Unlike the wavefunction of quantum mechanics, EM fields are a vector field with the boundary condition allowing perpendicular electric fields to be discontinuous with surface charges of conductors.

FIGS. 10A and 10B show the electric and magnetic field distribution of the $TM_{010}$ in a cylindrical cavity. Two different lengths of cavities (0.2 m (FIG. 10A) and 0.05 m (FIG. 10B)) have the same resonance frequency, but the magnetic field inside the cavity is inversely proportional to the length of the cavities. It is noteworthy that a similar mode exists in most of the hollow cavities as disclosed herein.

Superconducting Cavities for Low Loss Operation

Longitudinally squeezed cavities have mode volumes limited by penetration depth. However, decreasing the length of cavities, more fraction of the field is in the conductor resulting in a smaller Q-factor. To mitigate the loss, the cavity can be constructed out of a superconductor. There is a two-fold advantage; 1) a small penetration depth of tens of nanometers even at very low frequency enables high Q-factor cavities; 2) even within the penetration depth, the superconducting component reactively stores magnetic energy, and dissipation by normal component is small. The superconducting surfaces can be understood as the parallel circuit of an inductor (superconducting current) and a resistor (normal electron current) and the surface current proportional to tangential H field as the sum of the two currents.

Modified Designs for Small Samples

As shown in FIG. 11A, $TM_{010}$ mode has a high magnetic field near the sidewall. Often in the experiment of coupling spin ensembles to the microwave field, the shape and the size of a sample is not the same with the mode profile. In this case, a large magnetic field in an empty region increases the loss for nothing (It is noted that the transverse magnetic field creates surface current and subsequently, loss).

FIGS. 11B-11D show a few modified designs to match the field profile with samples. $TM_{010}$ mode in a cylindrical cavity generates uniform current flowing through the sidewall, and charges oscillate between the top and bottom plates. The cavity is effectively a parallel LC-circuit. The double split mode cavity, or the loop-gap cavity, (FIG. 11B) and the re-entrant cavity (FIG. 11C) are larger L, smaller C variant of cylindrical cavities. By the same logic, a double re-entrant cavity shown in FIG. 11D is the modification of $TM_{110}$ mode.

Mode Volume Reduction of Re-Entrant Cavities

The cavity was devised with a further reduced mode volume. In a re-entrant cavity, current flows through the metallic wall and the displacement current flows between the top surface of the pillar and the top wall. A large magnetic field originates from these currents. If the current density is increased by shrinking the diameter of the re-entrance, the capacitance between two parallel metal surfaces is reduced, increasing resonance frequency. Thus, a bigger resonator is required to compensate for the increased resonance frequency. However, the re-entrance can be tapered to locally create a high magnetic field. FIGS. 12A-12C show the design disclosed herein where the pillar is tapered to achieve a large capacitance and a high current density simultaneously. In this cavity design, there is a higher-order mode (FIGS. 12D-12F). This mode has a uniform large magnetic field within the gap between the pillar and the top plate. This mode can be understood as a rotated $TM_{010}$ mode transversally squeezed by the tapered pillar. More specifically, a mode structure similar to the $TM_{010}$, where the magnetic field circulates, and the electric field crosses it, almost always exists in any cavities as previously mentioned. This is because a hollow conductor's capacitor and inductor forms parallel LC-circuit. The transversal squeezing is disclosed subsequently herein.

Local Field Enhancement by Magnetic Field Expulsion

Applying Faraday's law for good/super-conductors ($\sigma \gg 1$), $$\vec{\nabla} \times \vec{E} = -j\omega\vec{B} \xrightarrow{\vec{E}=0} \vec{B} = 0. \tag{6}$$

In other words, conductors expel magnetic fields. FIGS. 2, 13A and 13B show the magnetic field expulsion in the quasi-static limit for simplicity. As shown in FIG. 13A, parallel external magnetic field circumvents the conductor resulting in a higher density of magnetic field lines. In FIGS. 2, 13A the line density represents field intensity. This field "crowding" or "squeezing" is more dramatic when the conductor is elongated (FIG. 2). The magnetic field at the surfaces of a structure can be expressed by demagnetization factors (N);

$$H_{surf} = \frac{H_0}{1-N}, \tag{7}$$

where $H_0$ and $H_{surf}$ are the external magnetic field and the field at the surface respectively, and N is the demagnetization factor. Indeed, an infinitely thin conductor has the unity demagnetization factor resulting in a diverging magnetic field. Physically, the penetration depth "smears out" the structure, and the field is finite (FIG. 2, inset).

As previously disclosed herein, the advantage of using superconductors is three-fold; 1) London penetration depth is on the order of tens of nanometers, which is much smaller than conductors' penetration depth of micron at a few GHz; 2) the gap between two is much larger at lower frequencies for e.g. nuclear magnetic resonances (NMR) applications; 3) superconductors have a lower loss resulting in high Q-factors.

FIGS. 13B and 13C show the field distribution in a cylindrical cavity resonator design including a field expulsion structure/component. Notably, this expulsion structure can be inserted in any cavity at the position where the magnetic field is aligned such as, for example, in a manner similar to that illustrated for FIG. 2. The $TM_{010}$ mode has the advantage that it has a small mode volume from the starting point.

The result of FIGS. 12D-12F can now be interpreted by looking the cavity in a rotated coordinate system ((x, y, z) (y, z, x)), where the mode is $TM_{010}$ with the conical expulsion structure. Since the expulsion structure is not like a thin plate/sba, the local enhancement of the field is relatively less, but this design achieves relatively more uniform fields over a relatively larger area than in cases where flux squeezing is affected by a thin plate or slab.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize or be able to ascertain, using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of"

"Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An apparatus, comprising:
   a source to generate a magnetic field;
   an enclosure to receive the generated magnetic field, the enclosure being composed of a superconducting material; and
   a superconductor element positioned within the enclosure such that a length of the superconductor element is perpendicular to a plane of the enclosure, wherein the length of the superconductor element is greater than a width of the superconductor element, such that a gap is created between an edge of the superconductor element and a wall of the enclosure,
   wherein during use, the enclosure excludes the magnetic field and the superconductor element excludes the magnetic field such that a magnetic flux density of the magnetic field in the gap is increased.

2. The apparatus of claim 1, wherein the superconductor element is shaped and positioned within the enclosure to have a demagnetization factor of about 1.

3. The apparatus of claim 1, wherein the magnetic field is a static magnetic field.

4. The apparatus of claim 1, wherein the magnetic field is a time-varying magnetic field.

5. The apparatus of claim 4, wherein the magnetic field varies at a frequency of up to about 300 GHz.

6. The apparatus of claim 4, wherein the enclosure is configured as a resonator for a frequency of the magnetic field.

7. A method, comprising:
   disposing a superconductor element in an enclosure, wherein a length of the superconductor element is perpendicular to a plane of the enclosure, wherein the length of the superconductor element is greater than a width of the superconductor element such that a gap is created between an edge of the superconductor element and a wall of the enclosure; and
   applying a magnetic field to the enclosure, wherein the enclosure excludes the magnetic field and the superconductor element excludes the magnetic field such that a magnetic flux density of the magnetic field in the gap is increased.

8. The method of claim 7, wherein the superconductor element is shaped and positioned within the enclosure to have a demagnetizing factor of about 1.

9. The method of claim 7, wherein the applying the magnetic field includes applying a static magnetic field.

10. The method of claim 7, wherein the applying the magnetic field includes applying a time-varying magnetic field.

11. The method of claim 10, wherein the magnetic field varies at a frequency of up to about 300 GHz.

12. The method of claim 10, wherein the enclosure is configured as a resonator of a frequency of the magnetic field.

13. The apparatus of claim 1, wherein a ratio of a height of the superconductor element to the length of the superconductor element is from about 0.1 to about 0.0001.

14. The apparatus of claim 1, wherein the superconductor element is a first superconductor element and wherein the gap is a first gap, further comprising a second superconductor element positioned such that magnetic flux density is increased between:
   a second gap formed between the first superconductor element and the second superconductor element; and
   a third gap formed between the second superconductor element and the enclosure.

15. The apparatus of claim 1, wherein the source is disposed outside the enclosure, and wherein the generated magnetic field is contained within the enclosure.

16. The apparatus of claim 6, wherein a mode of the resonator is a TE mode or a TM mode.

17. The apparatus of claim 1, wherein the source is configured to generate the magnetic field as a time-varying magnetic field.

* * * * *